United States Patent [19]

Baker

[11] 4,409,688
[45] Oct. 11, 1983

[54] PROCESSOR CONTROLLED, SCANNING RADIO RECEIVER INCLUDING FUTURE CODE DEVELOPING MEANS

[75] Inventor: William Baker, Indianapolis, Ind.

[73] Assignee: Masco Corporation of Indiana, Cumberland, Ind.

[21] Appl. No.: 392,458

[22] Filed: Jun. 28, 1982

Related U.S. Application Data

[63] Continuation-in-part of Ser. No. 154,032, May 28, 1980, abandoned, which is a continuation-in-part of Ser. No. 34,738, Apr. 30, 1979, Pat. No. 4,270,217.

[51] Int. Cl.³ .............................................. H03J 7/18
[52] U.S. Cl. .................................. 455/165; 455/166; 455/168; 455/186
[58] Field of Search ............... 455/161, 165, 166, 168, 455/185, 186

[56] References Cited

U.S. PATENT DOCUMENTS

| | | | |
|---|---|---|---|
| 3,725,788 | 4/1973 | Fathauer | 455/166 |
| 3,961,261 | 6/1976 | Pflasterer | 455/165 |
| 3,962,644 | 6/1976 | Baker | 435/165 |
| 4,081,752 | 3/1978 | Sumi | 455/165 |
| 4,092,594 | 5/1978 | Baker | 455/165 |
| 4,114,103 | 9/1978 | Pflasterer | 455/165 |
| 4,123,715 | 10/1978 | Fathauer | 455/168 |
| 4,135,158 | 1/1979 | Parmet | 455/165 |

FOREIGN PATENT DOCUMENTS 2544511  4/1976  Fed. Rep. of Germany ...... 455/161

Primary Examiner—Jin F. Ng
Attorney, Agent, or Firm—Neuman, Williams, Anderson & Olson

[57] ABSTRACT

There is disclosed a scanning radio receiver intended for use on the frequencies assigned to the Public Safety Radio Services and which is also operable for reception in the aircraft band from 118 MHz to 136 MHz. The receiver is operated under the control of a microcomputer which includes a ROM and a processor. The processor outputs a frequency code to a frequency synthesizer which controls the frequency of signals received by the receiver and at the same time, the processor synchronizes a timer which determines the amount of time allowed for the synthesizer to lock on a frequency before a signal present line is tested. While waiting for the synthesizer to lock, the system finds the next code which it will output. The time left after finding the next code is devoted to refreshing a display. When the synthesizer lock time has elapsed, the timer generates an interrupt signal which is transmitted to the processor and if the system is in a scanning mode and no signal is received, a new code is immediately output to the synthesizer.

17 Claims, 32 Drawing Figures

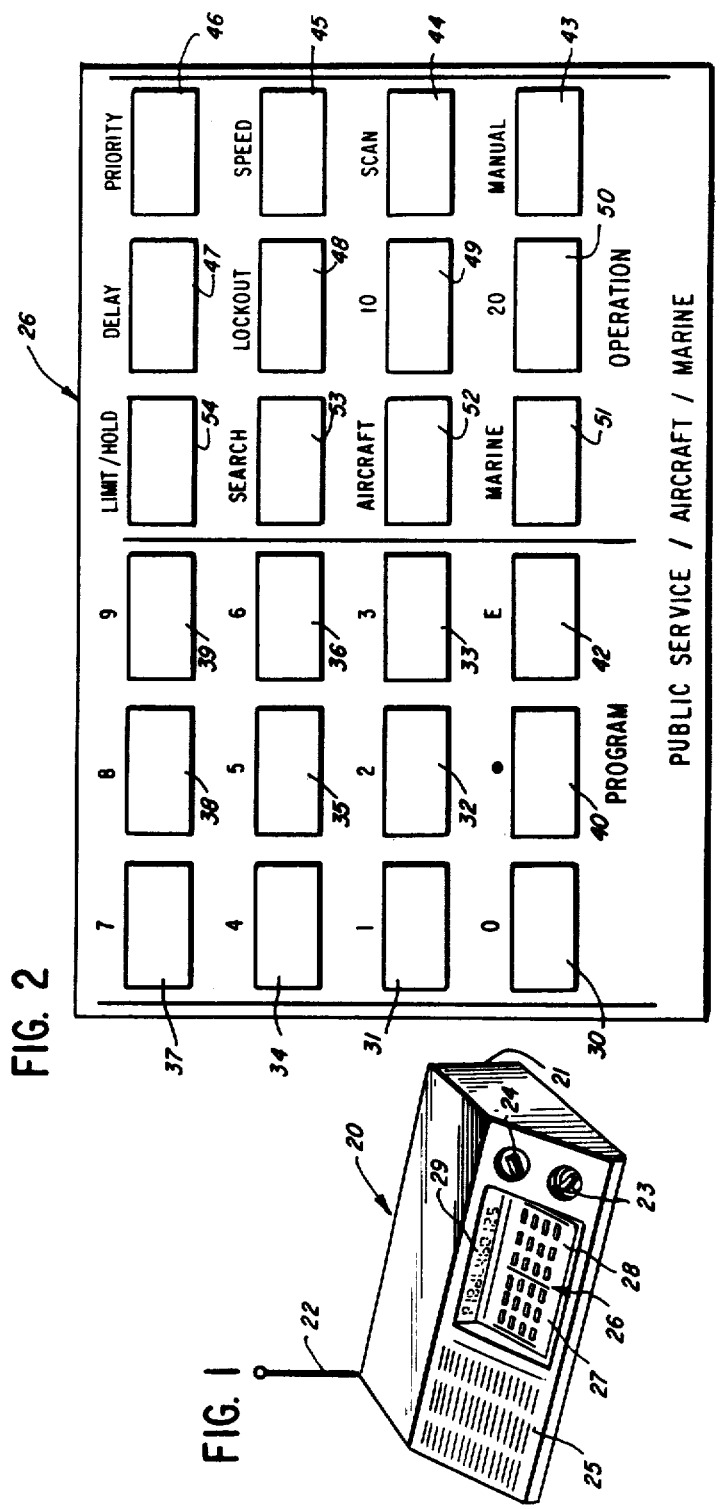
FIG. 2
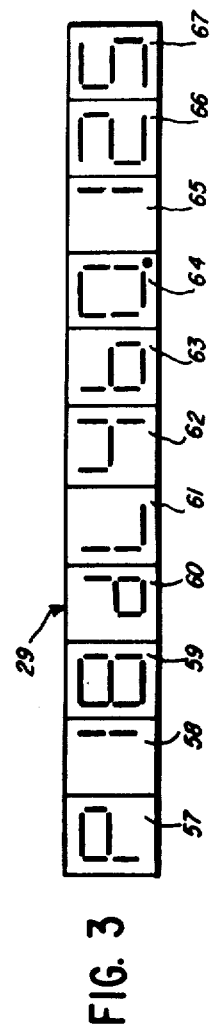
FIG. 3
FIG. 1

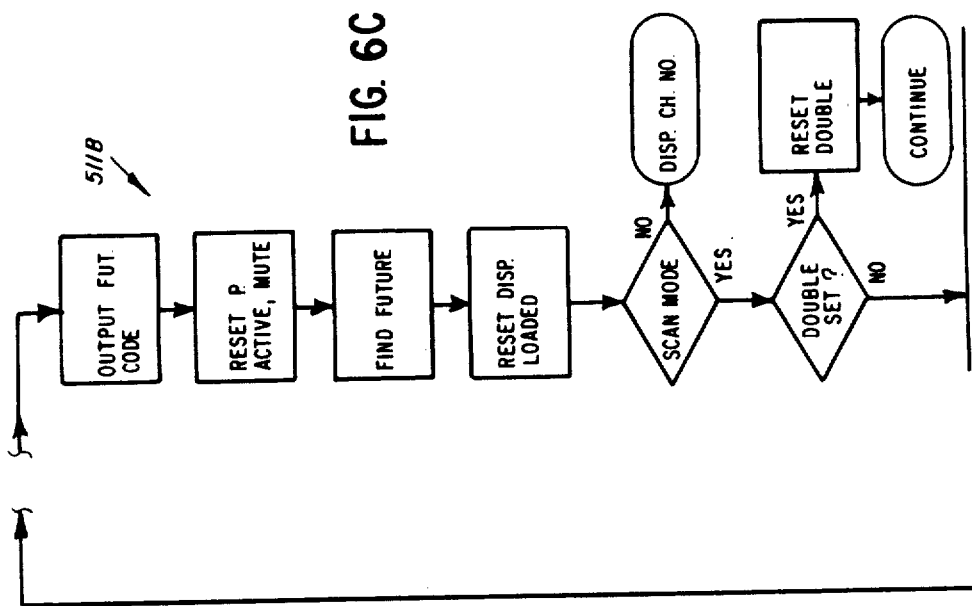
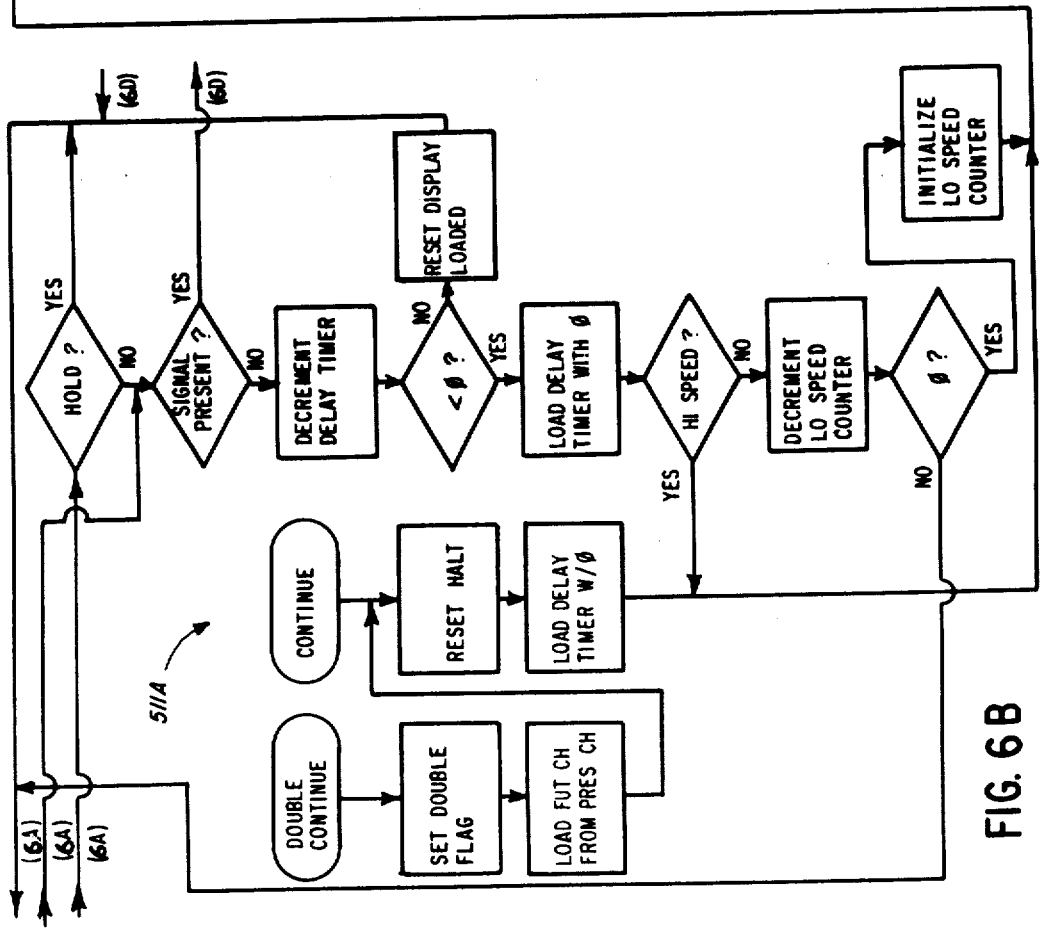
FIG. 6C
FIG. 6B

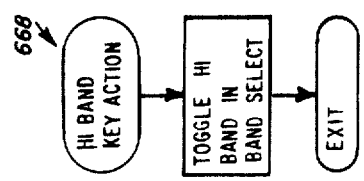
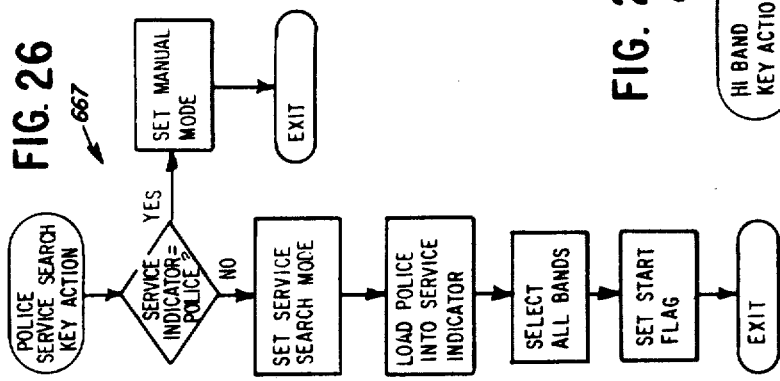
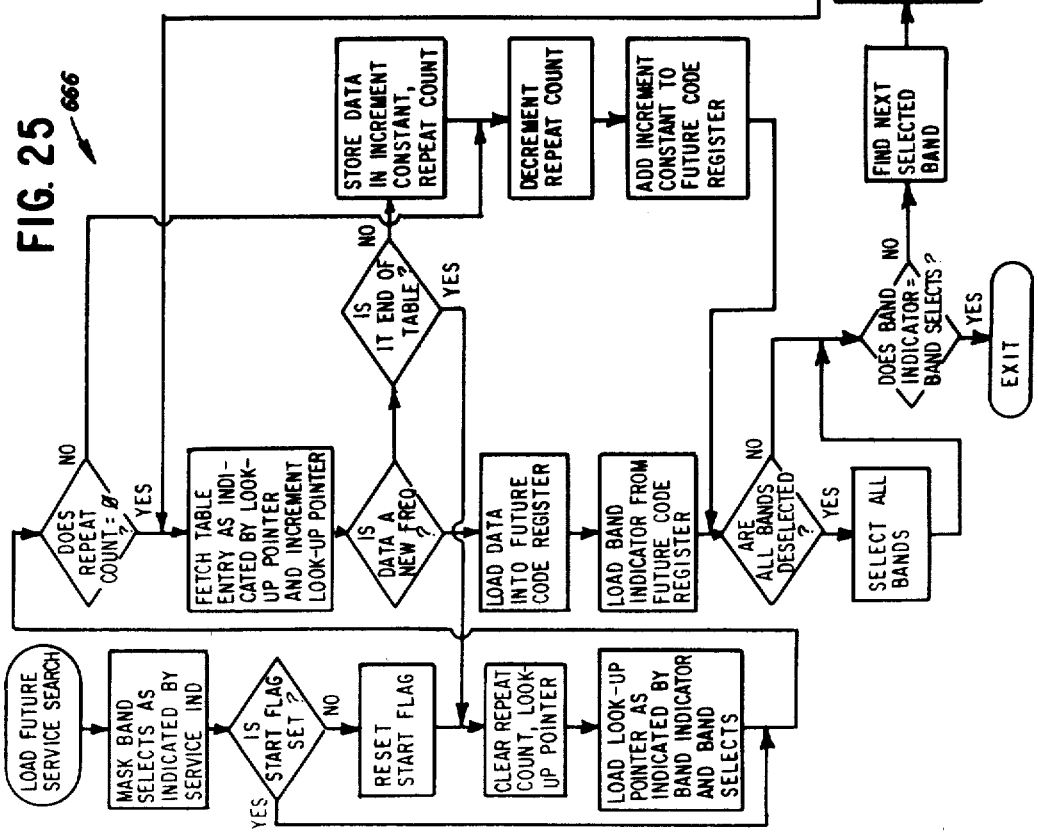

PROCESSOR CONTROLLED, SCANNING RADIO RECEIVER INCLUDING FUTURE CODE DEVELOPING MEANS

This application is a continuation-in-part of my copending application Ser. No. 154,032 filed May 28, 1980, now abandoned which is a continuation-in-part application with respect to my application Ser. No. 034,738 filed Apr. 30, 1979 now U.S. Pat. No. 4,270,217, issued May 26, 1981.

BACKGROUND OF THE INVENTION

This invention relates to scanning radio receivers and, more particularly, to scanning radio receivers particularly useful on the frequencies assigned to the Public Safety Radio Services as well as other frequencies.

Scanning radio receivers are well known in the prior art and have found particular utility for the reception of radio signals on the frequencies assigned by the United States Federal Communications Commission to the Public Safety Radio Services. In the past, many such radio receivers used crystals as the tuning element to provide the necessary local oscillator signals and required the presence of one crystal for each frequency the receiver was capable of tuning. Examples of such receivers are those shown in U.S. Pat. Nos. 3,531,724 to G. H. Fathauer, 3,665,318 to S. J. Hoffman, et. al., 3,714,585 to R. C. Koch, 3,725,788 to G. H. Fathauer, 3,794,925 to K. Imazeki, 3,801,914 to K. Imazeki, 3,821,651 to G. H. Fathauer, et al., 3,873,924 to G. H. Fathauer, 3,883,808 to J. E. Boone, 3,824,475 to P. W. Pflasterer, and 3,987,400 to G. H. Fathauer. Recently, scanning radio receivers using frequency synthesizing techniques have been provided which eliminated the need for a large number of crystals in radio receivers capable of being tuned to a large number of frequencies. Such receivers are shown in U.S. Pat. Nos. 3,937,972 to S. C. Snell, 3,961,261 to P. W. Pflasterer, 4,000,468 to J. R. Brown, et al., 4,027,251 to G. H. Fathauer, et al., 4,114,103 to P. W. Pflasterer, and 4,123,715 to G. H. Fathauer. There has also been provided by the prior art scanning radio receivers using frequency synthesizing techniques wherein the frequency synthesizing circuitry was controlled by the operation of a processing means such as a microprocessor. Exemplary radio receivers of this last mentioned type are disclosed in U.S. Pat. Nos. 3,962,644 and 4,092,594 both to W. Baker as well as the presently pending United States application Ser. Nos. 847,497 to G. H. Fathauer, et al., 847,566 to G. H. Fathauer, 000,905 of W. L. Williamson, et al., and 001,013 of A. Khan, et al.

Scanning radio receivers making use of microprocessors to control the frequency synthesizing circuitry have many advantages over the scanning radio receivers known prior thereto. One of the foremost of these advantages is the very high degree of flexibility in control which may be included in such a radio. An example is the "search" mode of operation shown in the aforementioned U.S. Pat. Nos. 3,962,644 and 4,092,594 by which the radio may be successively and automatically tuned to adjacent ones of the Public Safety Radio Service frequencies until the receiver arrives at a frequency upon which a signal is received. Such operation was impractical with scanning radio receivers known prior thereto.

The search mode of operation described above, while being a very advantageous feature, has certain disadvantages and problems which had not been recognized and attacked and, as a result, improved systems have been developed. In particular, systems which embody certain improvements which I invented are disclosed in my aforesaid copending application Ser. No. 034,738, filed Apr. 30, 1979 now U.S. Pat. No. 4,270,217, issued May 26, 1981. It is here noted that such systems also include additional improvements made in accordance with this invention and such additional improvements were disclosed in said application because they had been developed prior thereto and were contemplated as being the best modes known for carrying out the invention as claimed in said application.

As disclosed in my aforesaid copending application, circuitry is provided to enable searching of only those frequencies assigned to particular ones of the services. Such circuitry is also operative to permit reception of both amplitude and frequency modulated signals and to permit searching of both a service such as the aircraft band which utilizes amplitude modulation and another service such as the marine band which uses frequency modulation. The circuitry has other features and advantages including a feature in which both public safety frequencies and aircraft communication frequencies may be scanned in an intermixed and arbitrarily selected order.

The features to which the claims of my aforesaid application are directed are thus highly advantageous but they did not provide a solution to another problem with prior receivers which had not been recognized and attacked. In prior receivers, each time the radio was to be tuned to a new frequency, a signal was first generated to indicate to the controller or microprocessor the need to tune to a new frequency and only after the generation of that signal would the controller or microprocessor commence performing the operations required to generate the control signals effective to retune the receiver to the newly desired frequency. This procedure was particularly disadvantageous when the receiver was used either in a search mode of operation as described above or in a scan mode wherein the receiver is sequentially tuned to frequencies previously selected by the user, as this procedure placed a limitation on the rate at which frequencies could be scanned or searched; however, the problem is of greater import during the search mode of operation wherein it may be desired to search a large number of frequencies.

In particular, the time to search or scan any particular frequency in a receiver using a phase-locked-loop frequency synthesizer circuit was at least as long as the sum of three time periods, the time required for the controller or microprocessor to generate the control signals necessary to tune the frequency receiver to the new frequency, the "settling time" for the phase-locked-loop to adjust itself and bring the local oscillator signal to the desired frequency, and the time needed for the receiver circuitry to reliably detect the presence or absence of a received signal above a minimum signal level at the new frequency. Any steps taken to reduce any of these three time periods can be of importance in materially shortening the time required to search a large number of frequencies. The reduction occurs each time a new frequency is tuned so that the shortening of the time required to search a number of frequencies is equal to the reduction in the time period required for any individual frequency times the number of frequencies searched.

Any such reduction in time can be particularly advantageous in receivers such as aforementioned which have the capability of searching all frequencies assigned to a particular service since in some cases, the number of frequencies assigned to a single service may be large. However, in shortening the time required to tune a receiver to a new frequency during the search or scan modes, it must be recognized that in some cases, the user will use the receiver in a manual mode wherein he will either cause it to become tuned to either one of a plurality of preselected frequencies or to a frequency being newly specified by the user. Increasing the search or scan speeds should not be at the expense of eliminating the capability for operation of the receiver in the manual mode.

Moreover, some scanning radio receivers include a priority operation wherein one receiver channel is assigned a priority status and the receiver automatically and periodically checks the frequency of that channel for the presence of a received signal and, if found, places the receiver on that channel. Any effort to shorten the scan or search time should not adversely affect the priority operation.

SUMMARY OF THE INVENTION

This invention was evolved with the general object of further improving upon scanning radio receivers, particularly with regard to making it possible for a user to obtain automatic scanning of many different bands or groups of frequencies.

Another object of the invention is to obtain such improvements without unduly increasing the complexity and expense of manufacture of a receiver and while obtaining highly reliable operation.

A further object of the invention is to provide means for reducing the time required to shift from one frequency to another in a searching or scanning operation.

In a receiver constructed in accordance with the invention, a digitally controlled frequency synthesizer is provided for generating a local oscillator signal for mixing with a received signal to produce an IF signal which is applied to a detector circuit to develop an audio output signal. A processor is provided which develops a frequency code for supply to the synthesizer, the code being determined from stored data in the processor and from a keyboard. The processor outputs the frequency code from a register and at the same time, it synchronizes a timer and also initiates the processing of data to supply a new code to the register. At the end of a time interval established by the timer, an interrupt signal is developed and if no indication is then developed on a "signal present" line of the detector, a new code is immediately output from the register to the synthesizer.

With this arrangement, the time required to shift from one frequency to another during a scanning or searching operation is substantially reduced and the time required to search through a number of frequencies is correspondingly reduced.

The receiver of the invention is preferably arranged to scan a number of groups of frequencies such as those assigned to particular services and the reduction in the scanning time is especially advantageous in such a receiver since a large number of frequencies may be included in one of such groups.

The receiver of the invention further includes an additional register which may be referred to as a present channel register and which is operative for registering a frequency code as it is output to the synthesizer. The present channel code so registered may be used in a number of ways. In a search mode of operation in which the scanning is through frequencies differing by incremental values, the code stored in the present channel register is usable for developing a new code for application to the first register. It is also usable to preserve information as to the present channel code for a manual mode of operation. In addition, it may be used for use in accommodating a priority status-checking operation, the receiver being operative to periodically check the particular channel having priority status, to determine whether a signal can be received on that channel.

Further important features of the invention relate to details of the operations of the receiver by which it is operative to obtain the advantages of being operative to develop a new code at the same time that it is operative to determine whether a single is present on the present channel, while also being selectively operable in the manual mode or in a channel scan mode as well as being operative for checking a channel having priority status. In particular, the system is operative in response to detection of an interrupt, when there is an update of the signal stored in the signal present channel. At this time, the system may be either ready for or in the middle of a priority sample, i.e., an operation in which the priority frequency is generated while determining whether a signal is developed. If the system is not ready for or in the middle of a priority sample, it goes on to routines for manual, scan or search modes. However, if priority has been selected and if it is time for a priority routine, a priority timer is initialized and a stored priority code is output to the synthesizer to tune the receiver to the priority frequency. Then after other operations, a test is made as to whether a signal was present at the time of the interrupt and if the manual mode is not selected, the system may operate to store and shift data in registers in a manner such that a frequency output at the time of the priority sample is saved for use in a find future operation, to continue a search or channel scan operation. The system is thus arranged in a manner such that any of several modes of operation may be employed in a highly reliable manner while achieving a high scanning rate and the other aforementioned advantages.

Another feature of the invention relates to the processing of data in a manner such that the scanning speed is adjustable without requiring any new programming, the system being highly flexible. In certain situations such as in scanning through service groups which contain a very large number of frequencies, only a few of which may be active at any given time in any given locality, the use of a high scanning speed is highly desirable. In other situations, it may be desirable to use a slow scanning speed. The system of the invention can be adjusted to obtain any desired scan speed between a high scan speed and a low scan speed, as desired.

Additional features include the provision of an operational procedure or routine for obtaining selective control of manual, scan and service search modes of operation with display of the frequencies being searched and other data, in a highly reliable fashion.

This invention contemplates other objects, features and advantages which will become more fully apparent from the following description taken in conjunction with the accompanying drawings.

BRIEF DESCRIPTION OF THE DRAWINGS

FIG. 1 is a perspective view of a scanning radio receiver constructed in accordance with the invention;

FIG. 2 is a plan view of a keyboard of the radio of FIG. 1;

FIG. 3 is a plan view of a display of the receiver of FIG. 1, illustrating indications obtained in a certain condition of operation;

FIGS. 6A through 6E together provide a flow chart for a main routine which is provided in the operation of the processor circuits of FIG. 5;

FIG. 25 provides a flow chart illustrating a load future routine used in conjunction with service searches with the processor circuitry illustrated in FIG. 22;

FIG. 26 provides a flow chart illustrating a routine followed by the processor circuit of FIG. 25 in conjunction with a police service search; and FIG. 27 provides a flow chart illustrating a routine followed in connection with a high band key action routine of the processor circuitry of FIG. 22.

DESCRIPTION OF A PREFERRED EMBODIMENT

Figure 4:
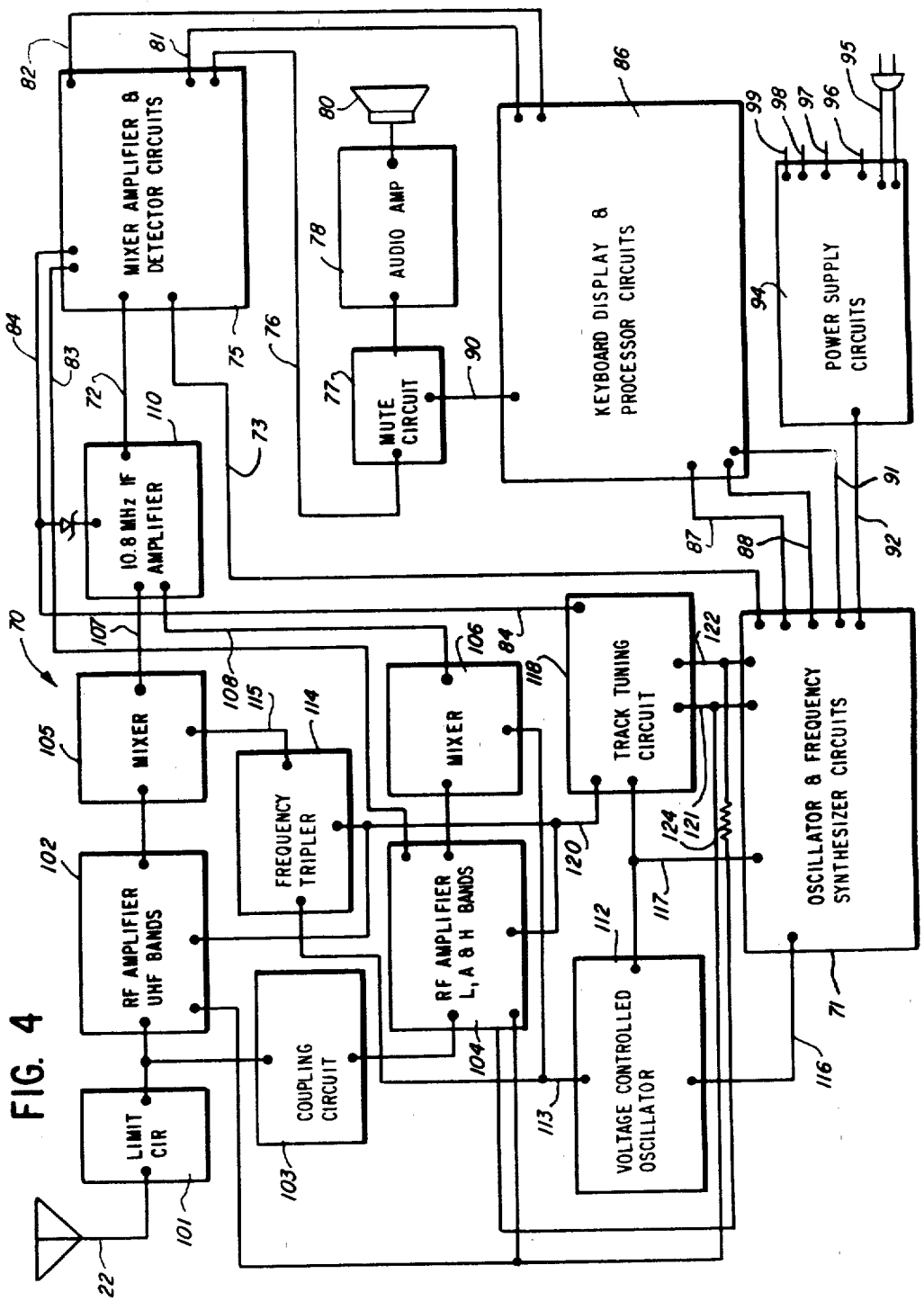
FIG. 4 is a schematic block diagram of the circuitry of the receiver of FIG. 1.

Reference 20 generally designates a scanning receiver constructed in accordance with the principles of this invention. The receiver 20 as shown in FIG. 1 may include a cabinet 21 having a telescopic antenna 22 projecting therefrom, having volume and squelch control knobs 23 and 24 on a front inclined face thereof, and having a grill portion 25 behind which a speaker is mounted.

The operation of the receiver 20 is controlled from a keyboard 26 which includes a left-hand program section 27 including numeric keys for entering in frequencies to be received and a right-hand operation section 28 including keys for effecting manual and various automatic control functions. In addition, the receiver 20 includes a display 29 for indicating the frequency to which the receiver is tuned and for indicating the status of various channels and control functions of the receiver.

In a typical operation of the receiver 20, it may be tuned to a certain frequency as indicated by the display 29. In a manual mode of operation, or when a "hold" feature is selected, the receiver will remain tuned to that frequency indefinitely. The receiver will also perform an automatic scanning operation in which it senses the termination of a signal and then automatically tunes itself to a new frequency. If no signal is sensed at the new frequency within a certain time interval, the receiver then automatically tunes to another new frequency, continuing until a frequency is found at which a signal is received.

The frequencies to which the receiver tunes itself are controllable by entering selected frequencies into a memory, using the program section 27 of the keyboard 26, or the receiver may search between selected frequency limits or the receiver may scan through frequencies designated by the Federal Communications Commission for marine or aircraft use.

FIG. 2 shows the arrangement of the keyboard 26 in which the program section 27 includes 10 numeric keys respectively designated by reference numerals 30–39 and operative for signaling the digits 0 through 9. The program section 27 further includes a decimal key 40 and a key 42 labeled "E" and operative for effective entry of frequency selected through the use of the numeric keys 30–39 and decimal point key 40.

The operation section 28 includes twelve keys for obtaining various operations. A "MANUAL" key 43 is operable for stopping a scanning or searching operation and for stepping the receiver through all of its channels, the illustrated receiver having twenty channels.

A "SCAN" key 44 is usable for initiating the scanning of all channels. A speed key 45 is operable for selecting between slow and fast scan or search rates which may be four or eleven channels per second, respectively.

A "PRIORITY" key 46 is operable to cause the receiver to switch to one channel such as Channel 1 periodically, for example, every two seconds, regardless of any other signals.

A "DELAY" key 47 is usable to interpose a predetermined delay between the end of a transmission on one channel and the initiation of a scan or search for a new frequency, this key being usable primarily for allowing monitoring of two-way conversations.

A "LOCK-OUT" key 48 is operable for locking out one or more channels during a scanning operation.

Keys 49 and 50, respectively labeled as "10" and "20" keys, are provided for control of the inclusion or exclusion of either of two banks of ten channels each in the scanning operation.

A "MARINE" key 51 is provided for effecting the automatic scanning of signals in a band designated by the Federal Communications Commission for marine use and an "AIRCRAFT" key 52 is provided for effecting an automatic scanning of frequencies designated by the Federal Communications Commission for aircraft use.

A "SEARCH" key 53 is provided for initiating a searching between certain frequencies which may be preselected through the use of the keyboard section 27 and a "LIMIT-HOLD" key 54. In addition to being usable to enter the search frequency limits, the key 54 is usable to hold the frequency of tuning at a frequency to which the receiver is tuned when the key 54 is depressed.

The operations of all of the keys and also the operation of the display 29 are described in more detail hereinafter in connection with a description of the operation of the control circuitry of the receiver. It is here noted, however, that the display 29 includes eleven spaces or "windows" indicated by reference numerals 57–67. The first five spaces 57–61 are used for indicating the status of priority and other controls as well as the number of the channel being received, while the last six spaces indicate the frequency to which the receiver is tuned. In the condition of the display 29 as illustrated in FIG. 3, the receiver is tuned to 460.125 MHz, the receiver is operated on channel 18 as indicated in the second and third windows 58 and 59, the channel has priority status as indicated by the letter "P" in window 57, a delay operation is in effect as to the selected frequency as indicated by the letter "d" in window 60 and the lock-out function is effective as to the selected channel as indicated by the letter "L" in the window 61.

The receiver 20 has circuitry such that it accurately tunes itself to any one of a very large number of frequencies and rapidly scans groups of frequencies selected by the user, responding only to signals of possible interest to the user. With respect to the frequencies covered, the receiver may cover the "Low" and "high" VHF bands and the UHF band which are designated for public service use by the FCC (United States Federal Communications Commission), respectively extending from 30–50 MHz, 148–174 MHz and 450–470 MHz. The maritime band from 156.275 to 162.000 MHz controlled by the "MARINE" key 51 is included within the "High" VHF band. In addition, the receiver covers a band designated by the FCC for aircraft use, extending from 118 to 136 MHz and a band from 144 to 148 MHz which includes the 2-meter amateur band.

The receiver also covers UHF frequencies from 420.5 to 450 MHz including an amateur band from 442.050 to 444.950 and UHF frequencies from 470 to 512 MHz designated as a television or "T" band. For convenience, "L" is used herein to designate the frequency range or band from 30 to 50 MHz, "A" designates an aircraft band from 118 to 136 MHz, "H" designates a VHF band from 144 to 174 MHz and "UHF" designates a band from 420.5 to 512 MHz.

Specific features of the receiver relate to arrangements such that the FCC requirements with respect to modes of modulation and frequency spacings between adjacent channels are taken into account, to obtain efficient and reliable reception while minimizing the complexity of the receiver.

FIG. 4 is a schematic block diagram of the circuitry of the receiver 20. A receiver 20 has three principal portions. The first is an RF portion generally indicated by reference numeral 70 which is controlled from oscillator and frequency synthesizer circuits 71 to develop from any signal on antenna 22 which is a selected frequency channel, a 10.8 MHz IF signal on a line 72. Also, a 10.4 MHz reference signal is developed on an output line 73 from the oscillator and frequency synthesizer circuits 71.

The second principal portion of the receiver includes mixer, amplifier and detector circuits 75 which respond to the 10.8 MHz IF signal on line 72 and the 10.4 MHz reference signal on line 73, used as a second local oscillator signal, to develop an audio output signal applied through a line 76 and through a mute circuit 77 and an audio amplifier circuit 78 to a speaker 80. The mixer, amplifier and detector circuits 75 include a squelch circuit which controls operation to cause an audio output signal to be developed only when a received signal of above a certain strength is received. The squelch circuit also develops a control signal on a line 81 for signaling the absence of a received signal such as to cause scanning to continue when a scanning mode of operation is selected.

The mixer, amplifier and detector circuits 75 include demodulators for both FM and AM reception and an A-band control signal is applied thereto through a line 82 to condition the circuits for AM reception which is required in the "A" or aircraft band from 118 to 136 MHz.

Additional functions of the circuits 75 include generation of an AGC or automatic gain control signal on a line 83 and a signal on a line 84 for control of tuning in the RF portion 70 of the receiver.

Figure 5:
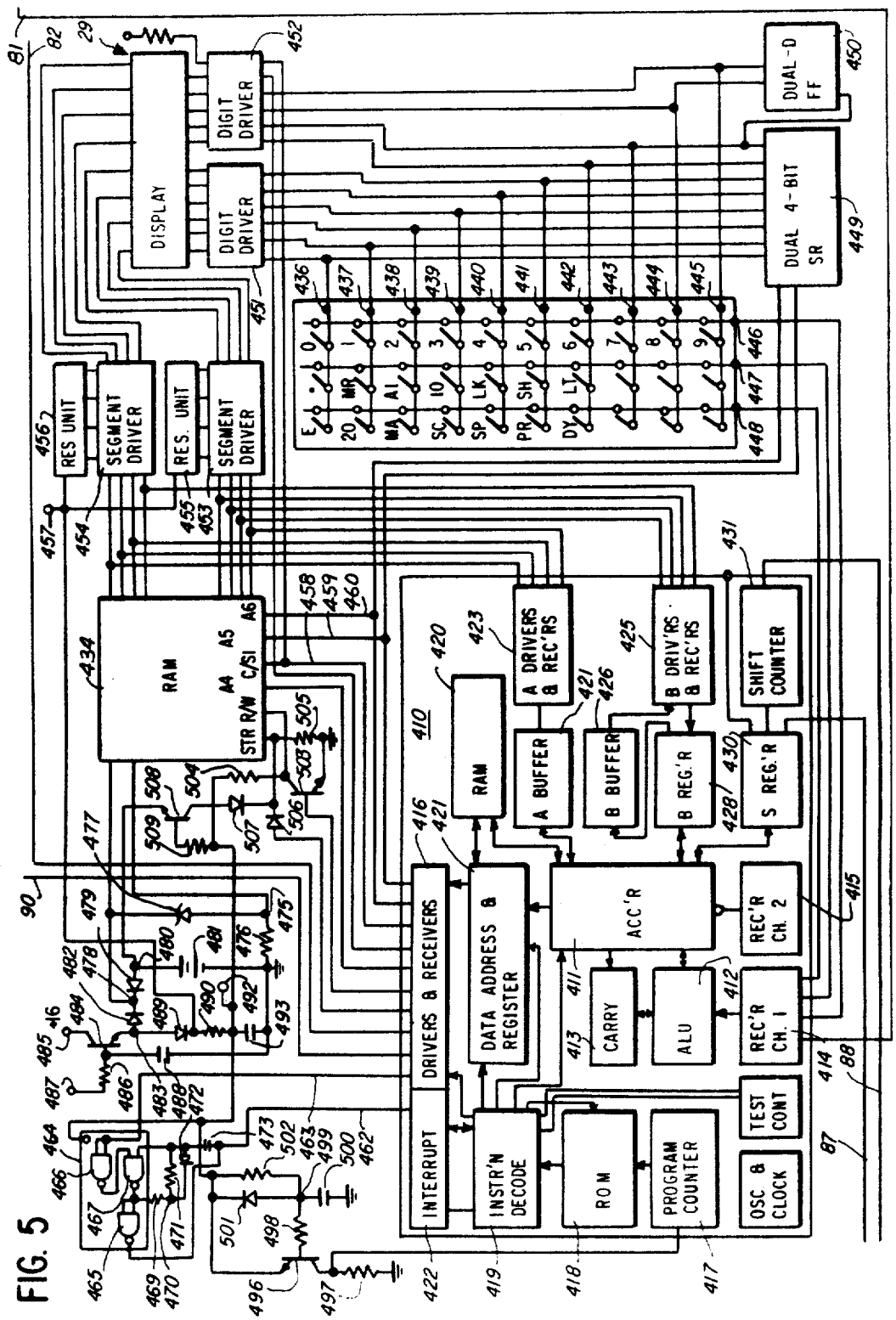
FIG. 5 is a schematic diagram of one form of keyboard display and processor circuits usable in the receiver and shown in block form in FIG. 4.

The third principal portion of the receiver 20 is a control portion and includes keyboard, display and processor circuits 86. To control the frequency of tuning of the RF portion, such circuits operate to supply data signals which are applied through a line 87 to the oscillator and frequency synthesizer circuits 71 along with clock signals applied through a ine 88. In addition, the circuits 86 develop a mute signal on a line 90, applied to the mute circuit 77 to silence the receiver during certain conditions of operation such as during switching from one channel to another. The circuits also develop the "A" band control signal on line 82. Circuits 86, of course, respond to the signals applied from operation of the various keys of the keyboard and, during a scanning operation, the circuits 86 respond to the control of squelch signal applied thereto through the line 81. It is noted that although not used in the circuits 86 as illustrated in FIG. 5, a master clock signal at a frequency of 433 KHz may be applied from circuits 71 and through line 91 to the circuits 86 for possible usage for clock purposes.

Another 433 KHz signal may be applied from circuits 71 and through a line 92 to a power supply circuit 94 in which the signal is divided down to a 25 KHz signal which is amplified and rectified to produce a 25 volt supply voltage on a line 95, the circuit 94 may be connected to a battery supply and/or a line cord 95 and develops various other DC supply voltages such as 5 volts, 9 volts and 11.4 volts on lines 97–99, respectively.

With respect to the RF portion 70, signals from the antenna 22 are applied to the input of a limit circuit 101 which may include diodes operative to prevent overload of the receiver from extremely strong signals and which may also include an inductor for attenuating frequencies below the H-band and to also provide an improved impedance match. The output of the limit circuit 101 is applied directly to the input of an RF amplifier circuit 102 for the UHF band (420–512 MHz) and through a coupling circuit 103 to the input of another RF amplifier 104 for the L, A and H bands (30–50, 118–136 and 144–174 MHz). The outputs of the RF amplifiers 102 and 104 are applied to inputs of UHF band and L, A and H band mixer circuits 105 and 106 which have outputs connected through lines 107 and 108 to inputs of a 10.8 MHz IF amplifier 110 connected to the line 72.

To develop a 10.8 MHz signal on the output line 107, the UHF band mixer circuit 105 is supplied with a signal which has a frequency 10.8 MHz lower than that of the signal to be received, the signal being thus variable in frequency over a range from 409.7 MHz to 501.2 MHz. To develop the signal for application to the mixer circuit 105, a voltage controlled oscillator 112 is operated in a lower frequency range and its output is connected through a line 113 to the input of a frequency tripler 114, the output of the frequency tripler 114 being applied through line 115 to the mixer circuit 105. Thus, to develop the local oscillator signal for reception in the 420.5–512 MHz UHF band, the voltage controlled oscillator 112 may be operated in a frequency range from 136.567 to 167.067 MHz.

The L, A and H band mixer circuit 106 is directly connected to the output line 113 of the voltage controlled oscillator. For operation in the L band from 30 to 50 MHz, and also for operation in the A-band from 118 to 136 MHz, the oscillator frequency is preferably above the desired signal frequency while for operation in the H band from 144 to 174 MHz, the oscillator frequency is below the desired signal frequency. Thus, for operation in the L, A and H bands, the voltage controlled oscillator 113 may supply signals in the ranges from 40.8 to 60.8 MHz, 128.8 to 146.8 MHz and 133.2 to 163.2 MHz.

For control of the frequency of operation of the voltage controlled oscillator 112, it has a second output which supplies a signal at its operating frequency through a line 116 to the oscillator and frequency synthesizer circuits 71. Circuits 71 respond to the signal so applied to develop a DC output signal on a line 117 which is applied to the oscillator 112 to maintain the output frequency of the oscillator 112 at a certain value determined by input data supplied to circuits 71 through line 87 from the keyboard, display and processor circuits 86.

The DC output signal on line 117 is also applied to a track-tuning circuit 118 which develops a corresponding DC control voltage on a line 120 which is connected to the RF amplifiers 102 and 104 and also to the frequency tripler 114, to control the tuning of tuned circuits therein, voltage-controlled capacitors being preferably provided in the circuits 102, 104 and 114 for this purpose.

The track-tuning circuit 118 is controlled from the A-band control signal on line 84 and is additionally controlled from control signals applied through lines 121 and 122 from the circuits 71 in accordance with input data supplied through line 87 from the keyboard, display and processor circuit 86. The signals on lines 121 and 122 are referred to herein as UHF and OSC signals, respectively. The UHF signal is developed during operation in the UHF band and the OSC signal is developed during operation in the A, H and UHF bands. Thus, the track-tuning circuit 118 responds to the variable DC control signal on line 117 and to the A-band, UHF and OSC control signals on lines 84, 121 and 122 to develop the DC control voltage on line 120 which is appropriate for control of the circuits 102, 104 and 114 according to the existent conditions of operation.

The UHF control signal on line 121 is also applied to the RF amplifiers 102 and 104 and operates to disable the UHF amplifier 102 during L, A and H band operation and to disable the L, A and H band amplifier 104 during UHF operation.

The OSC control signal on line 122 is also applied through a resistor 124 to the L, A and H band amplifier 104 and it operates to short out an inductor of the amplifier 104 to change its timing during operation in the A and H bands.

The details of the circuitry of the mixer, amplifier and detector circuits 75 are not disclosed herein but may preferably be constructed as disclosed in the aforementioned prior application of William Baker, Ser. No. 34,738, and also in the application of George H. Fathauer et al., Ser. No. 34,593, both filed on Apr. 30, 1979.

The details of the circuitry of the oscillator and frequency synthesizer circuits 71 are also not disclosed herein but are disclosed in the aforementioned application of William Baker, Ser. No. 34,738 and also in the application of George H. Fathauer, et al., Ser. No. 34,739, also filed on Apr. 30, 1979. The disclosures of said pending applications are incorporated herein by reference.

With respect to the mixer, amplifier and detector circuits 75 and the operation of the keyboard, display and processor circuits 86, it is particularly noted that the signal on line 81 signals the absence of a received signal to cause scanning to continue when a scanning mode of operation is selected and signals the presence of a received signal so as to discontinue scanning when there is a received signal. Line 81 and the circuitry to which it is connected thus form signal present means for output of a signal-present signal in response to reception of a signal at a frequency determined by the local oscillator frequency and the IF frequency. A signal on line 82 from the circuits 86 conditions the detector circuits for AM reception, required in the "A" or aircraft band from 118 to 136 MHz.

It is also noted that the frequency synthesizer circuits 71 may preferably include a shift register to which the binary equivalent of a certain number "M" is applied, the number "M" being determined in accordance with the signal frequency "F", the intermediate frequency, "IF" and the band of operation. The data are applied through the line 87 as a serial train of pulses.

The requirements as to the number M are summarized as follows:
Low Band
30 MHz to 50 MHz
M=65,536−200 (f+IF)
for 10.8 MHz IF, M is from 57,376 to 53,376, (binary, from 1110000000100000 to 1000110101010000)
Aircraft Band
118 MHz to 136 MHz
M=65,536−200 (f+IF)
for 10.8 MHz IF, M is from 39,776 to 36,716, (binary, from 1001101101100000 to 1000110101010000)
High Band
144 MHz to 174 MHz
M=65,536−200 (f−IF)
for 10.8 MHz IF, M is from 38,896 to 32,896, (binary, from 1001011111110000 to 1000000010000000)
UHF Band
4205 to 512 MHz
M=65,536−80 (f−IF)
for 10.8 MHz IF, M is from 32,760 to 25,440, (binary, from 0111111111111000 to 0110001101100000)
Foreign Band
66 to 88 MHz
M=65,536−200 (f−IF)

It is noted that in the low band, the three most significant digits are 111 at the low end and 110 at the high end, that in both the aircraft and high bands the three most significant digits are 100 and, in the UHF band, the three most significant digits are 011. In the logic circuitry for developing the UHF and A-H signals on lines 121 and 122, the UHF signal on line 21 is developed from the absence of a 1 in the most significant digit. The OSC signal on line 122 is developed by the concurrent development of a 1 in the most significant digit and a 1 as either the next digit or as the second from the most significant digit.

FIG. 5 is a schematic diagram of the keyboard, display and processor circuits 86. The circuits include a single-chip microcomputer 410 which is manufactured by the Microelectronics Group of Rockwell International Corporation and has a designation of MM78L.

The microcomputer 410 includes an accumulator 411, an arithmetic logic unit 412 and a carry flip-flop 413 for arithmetic operations and for loading and exchange of data. Upon command, data will be loaded into the contents of the accumulator 411 from channel 1 and channel 2 input ports which are connected to receivers 414 and 415.

The microcomputer 410 further includes ten discrete input/output ports which are provided by multiplexer drivers and receivers 416, a program counter 417, a read only memory 418, an instruction decode circuit 419, a random access memory 420 and a data address and register unit 421. The ROM 418 has a capacity of 204×8 and the RAM 420 has a capacity of 128×4.

An interrupt section 422 is provided for detecting external signals and setting internal control flip-flops. Drivers and receivers 423 are provided for channel A ports with an A buffer being provided for output of display functions through the A ports. Similarly, B drivers and receivers 425 and a B buffer 426 are provided, an auxiliary register 428 being associated therewith.

An S register 430 is provided which is a 4-bit serial-in/serial-out parallel exchange register, a shift counter 431 being connected thereto.

The microcomputer 410 operates in conjunction with a random access memory 434 which may be a CMOS memory having a 256×4 capacity and may be a type 74801 manufactured by National Semiconductor Corporation. The memory 434 is used to store program data entered in by the user of the receiver and is connected to a battery in a manner such that information entered in will be retained even when the receiver is disconnected from an AC voltage supply line.

The microcomputer 410 controls the transfer of information to and from the memory 434 and from the keyboard 26 and also performs its various functions in response to signals from the keyboard 26.

As shown in FIG. 5, the keyboard 26 includes switches which are operated by numeric keys 30–39 and which are respectively connected to terminals 436–445, all being connected to another terminal 446. Other switches are connected to an additional two terminals 447 and 448. Terminals 446–448 and the "signal present" line 81 from the circuits 75 are connected to "Channel 1" input ports provided by receiver 414.

For strobing of the keyboard 26 for transmission of information to the microcomputer 410 and memory 434, the terminals 436–443 are connected to outputs of a dual 4-bit shift register 449 while terminals 444 and 445 are connected to outputs of a dual D flip-flop 450, the shift register 449 and the flip-flop unit 450 being operated in cascade and together forming a 10-bit shift register operative to strobe the keys of the keyboard 26.

The outputs of the shift register 449 and dual D flip-flop 450 are connected to digit drivers 451 and 452 for the display 29 which has terminals connected to outputs of two four-segment driver circuits 453 and 454. Terminals of the circuits 453 and 454 are connected through resistor units 455 and 456 to a power supply terminal 457.

Control or input terminals of the segment drivers 453 and 454 are connected to "A" and "B" ports of the microcomputer 410, such ports being also connected to data inputs of the memory 434.

Three of the ten discrete input/output ports provided by the multiplexer drivers and receivers 416 are connected through lines 458, 459 and 460 to "C/S Sub 1" "A Sub 5" and "A Sub 6" terminals of the memory 434, lines 459 and 460 being also connected to the shift register 449.

In the operation of the circuitry as thus far described, the keyboard 26 is strobed by means of the 10-bit shift register provided by the circuits 449 and 450 to develop signals which are read into the memory 434 and/or which are stored temporarily within the microcomputer 410 for control of the operation of the receiver. The strobe signals are also applied to the digit driver circuits 451 and 452 which have outputs connected to the display 29. For operation of the display 29, data is multiplexed from the "A" and "B" output ports of the microcomputer 410 and through the segment drivers 453 and 454 to the display.

In the operation of the microcomputer 410, an interrupt signal is applied through a line 462 either periodically or at a certain time after the microcomputer 410 develops a signal on a line 463 connected to one of the input/output ports provided by the circuits 416. For this purpose, multivibrator circuit 464 is provided including three gates 465, 466 and 467 of an integrated circuit 468. The output of the gate 465 is connected to the line 462 while the two inputs thereof are connected together into the output of the gate 467, the inputs of gate 465 being also connected through a resistor 469 to a circuit point 470 which is connected through the parallel combination of a resistor 471 and a diode 472 to one input of gate 467 which is also connected through a capacitor 473 to the output line 462. The other input of gate 467 is connected to the output of the gate 466, the inputs of which are connected together into the line 463 which is connected to one of the ports provided by circuits 416.

The multivibrator circuit 464 operates as a free-running multivibrator to periodically apply an interrupt signal. Signals therefrom are usable to perform timing functions under programmed control of the processor to thereby provide timing means and the circuit 464 may be reset at any time in response to the application of a signal on line 463 to apply an interrupt signal after a certain delay time. The frequency and the delay time are determined by the values of the resistors 469, and 471 and the capacitor 473.

Circuitry is provided for the application of supply voltages in a manner such that the contents of the random access memory 434 will be retained when the receiver is disconnected from a supply line and in a manner such that the circuits will be properly initialized when the receiver is connected to a supply line and when the on-off switch is turned on.

One terminal of the RAM 434 is connected to a circuit point 475 which is connected through a resistor 476 to ground and through a zener diode 477 to a circuit point 478 which is connected to a second terminal of the RAM 434 and which is connected through a diode 479 to a terminal 480, a battery 481 being connected between terminal 480 and ground.

The circuit point 478 is also connected through a diode 482 to a circuit 483 which is connected to the emitter of a transistor 484 having a collector connected to a +16 volt supply terminal 485. The base of transistor 484 is connected through a resistor 486 to a +9 volt supply terminal 487 and is also connected through a capacitor 488 to ground. The circuit point 483 is additionally connected through a diode 489 to a circuit point which is connected to the terminal 457 for supplying power to the segment drivers 453 and 454 through the resistance units 455 and 456. Also, a resistor 490 is connected between terminal 457 and a terminal 492 connected through a capacitor 493 to ground. The terminal 492 is the voltage supply terminal for the microcomputer 410 and for other circuits including the shift register 449, flip-flop 450 and digit drivers 451 and 452.

In the operation of the power supply circuitry as thus far described, the battery 481 supplies an operating voltage to the RAM 434 when the receiver is disconnected from the line or when the on-off switch is off, the voltage being regulated by the zener diode 477. When line voltage is applied, the power supply circuits 94 are rendered operative to supply voltages to terminals 485 and 497 and the RAM 434 is then supplied with operating voltage through diode 482 and transistor 484 from the terminal 485. Operating voltage for the segment drivers 453 and 454 and for the microcomputer 410 and other circuits is supplied through the diode 489.

An active power-on reset circuit is provided including a transistor 496 having an emitter connected to the terminal 492 and having a collector connected through a resistor 497 to ground and also connected to an input of the program counter 417 of the microcomputer 410. The base of the transistor 496 is connected through a resistor 498 to a circuit point 499 which is connected through a capacitor 500 to ground and which is connected through the parallel combination of a diode 501 and a resistor 502 to the terminal 492.

In normal operation, transistor 496 is nonconductive. When the receiver has been turned off, the capacitor 500 will not be charged and when the receiver is turned on, the transistor 496 will be rendered conductive through the voltage supplied through resistor 502 and resistor 490 to the base thereof. The capacitor 500 will charge through the resistor 502 and when it is fully charged, the transistor 496 will be cut off. Thus, a step function is applied to the input of the program counter and the microcomputer 410 will be initialized to the first instruction.

Circuitry is also provided for insuring that data will not be improperly read into or removed from storage in the RAM 434 during a start-up. A read-write input of the RAM 434 is connected to the collector of a transistor 503 and also through a resistor 504 to the supply terminal 492, the emitter of the transistor 503 being connected to ground. The "STR" input of the RAM 434 is connected through a resistor 505 to ground, through a diode 506 to a point provided by the circuit 416 and though a diode 507 to the collector of a transistor 508, the emitter of the transistor 508 being connected to the battery terminal 480 and the base of the transistor 508 being connected through a resistor 509 to the supply terminal 492.

The operation of the processor circuitry is disclosed in detail in the flow charts depicted in the drawings. In examining the flow charts, the basic functions of the various keys and the operation of the display as described hereinbefore, should be kept in mind. The following detailed examples of the use of keys may also be helpful.

The user can program the receiver 20 to scan twenty different frequencies, one in each of the twenty channels. As an example, to program 162.55 MHz in a desired channel, for instance channel 14, the manual key 43 is pressed, repeatedly if necessary, to step until the desired channel 14 is reached which will be indicated by the appearance of numbers 1 and 4 in the second and third display windows of 58 and 59 (FIG. 3). Then numeric keys 31, 36, 32, 40 and 35 are pressed, whereupon "162.550" will appear in the last six windows of 62–67 of the display 29. Then the E or "ENTER" key 42 is depressed which will enter the frequency of 162.55 MHz in channel 14. Then the manual key may be depressed to step to a next channel 15, or to any other channel in which it may be desired to enter another frequency. The procedure may then be repeated.

If a user attempts to program a frequency that is outside the tuning range of the receiver, "ERROR" will appear on the display 29. If this happens, he may simply enter a new frequency. If the user makes a mistake programming the frequency on a channel, he may press the decimal point key 40 twice and then program the correct frequency.

To display any channel manually when scanning is stopped, the user may then press the one or two keys which identify the channel and then press the manual key 43.

To program a lock-out of any programmed frequency and to cause the receiver to skip over the frequency when scanning, the channel containing that frequency is first selected manually and the lock-out key 48 is pressed. The letter "L" will then appear in the fifth window 61 of the display 29.

Normally, the receiver will scan at a fast rate such as eleven channels per second, for example. To scan slowly, the speed key 45 may be pressed. To resume the fast scan, it may be pressed again.

As mentioned hereinbefore, the scanner may be programmed to pause for about one second after a transmission on any selected channel which is useful when both sides of a conversation are transmitted on the same frequency. The manual key 43 is pressed, repeatedly if necessary, to step to a selected channel and then the delay key 47 is pressed, whereupon the symbol "d" will appear in the fourth window 60 of the diaplay as shown in FIG. 3. To remove the delay function, the delay key 47 may be pressed again, and the symbol "d" will then disappear.

To search for unknown signals between two frequencies in the same band, the manual key is stepped to any one of the twenty channels which it may be desired to use for the purpose. Then numeric keys are depressed in the same manner as when programming the frequency, to enter one limit of the range to be searched. Then the limit/hold key 54 is pressed and then numeric keys for the other limit are pressed after which the limit/hold key 54 is pressed again to enter the other limit. Then when the search key 53 is pressed, the receiver will automatically search through the frequency range. When an active channel is found, the search will stop and the frequency will be displayed. Once the search has been started, the delay may be pressed which will program the delay function until the same delay key is pressed again or the search operation is terminated. If the user desires to store the active frequency in the channel in use for the search operation, he may simply press the "E" key 42. If the user desires to stay on the frequency, he may press the limit/hold key 54 which will then perform its hold function. The hold function may also be performed while searching without signal present.

If "ERROR" appears in place of a frequency, it indicates that the search limits set are not in the same band or that an out of band frequency was attempted.

To search the aircraft band, the aircraft key 52 is depressed, and the letter "a" will appear in the fifth window 61.

To search the maritime band, the "Marine" key 51 is pressed and the symbol "−" will appear in the fifth window 61 of the display.

FIGS. 6A, 6B, 6C, 6D and 6E depict a main routine flow chart showing the general operation of the system. It is noted that an important feature of the system is in the provision of a "Find Future" routine which is illustrated in detail in FIG. 7A and 7B and which increases the scanning rate of the system. With the routine, the system outputs a frequency code to the synthesizer and synchronizes an external timer which determines the amount of time allowed for the synthesizer to lock on a frequency before the signal present line is tested. While waiting for the synthesizer to lock, the system finds the next code it will output. The time left after finding the next code is devoted to refreshing the display. When the synthesizer lock time has elapsed, the external timer generates an interrupt signal which is transmitted to the processor. If the system is in a scanning mode and no signal is received, then the system is in a condition to immediately output a new code to the synthesizer. Thus, the scanning rate is increased. At the same time, the system is so constructed as to allow use of a manual mode and the priority features in a normal manner.

Figure 6A:
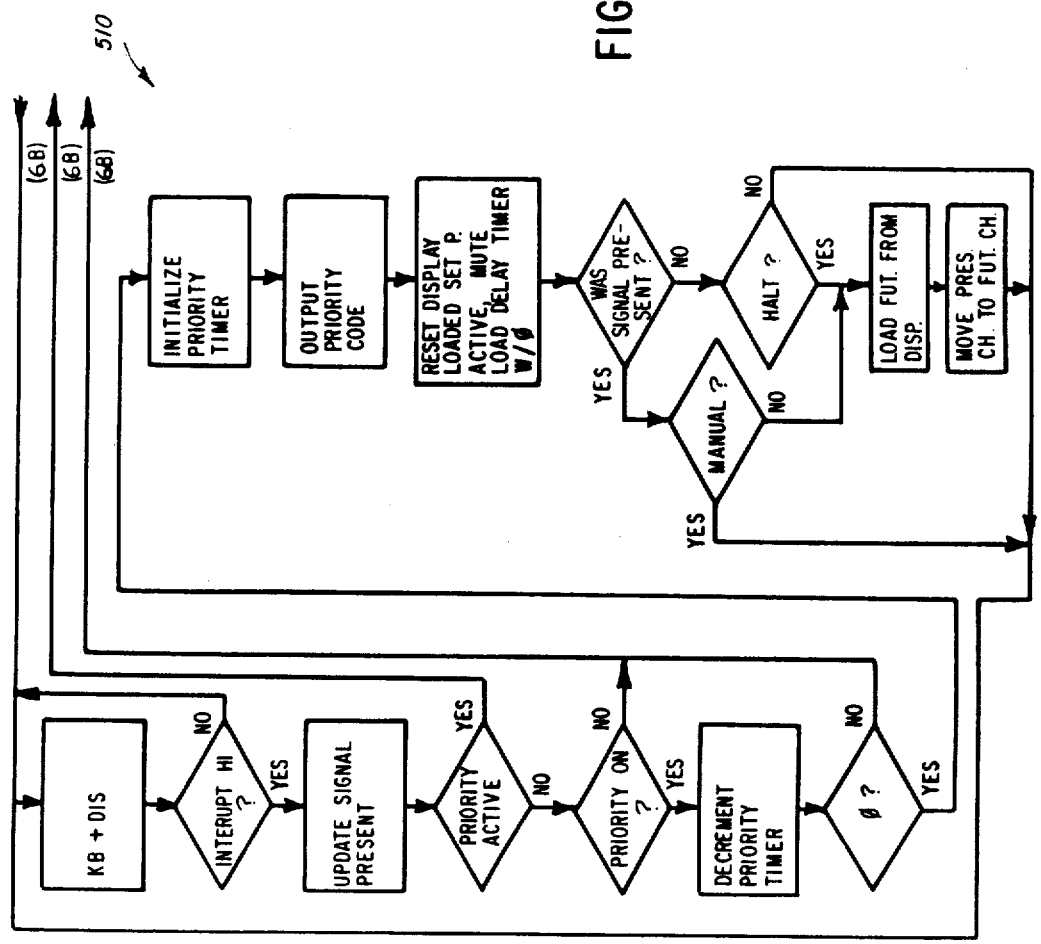
Figure 6E:
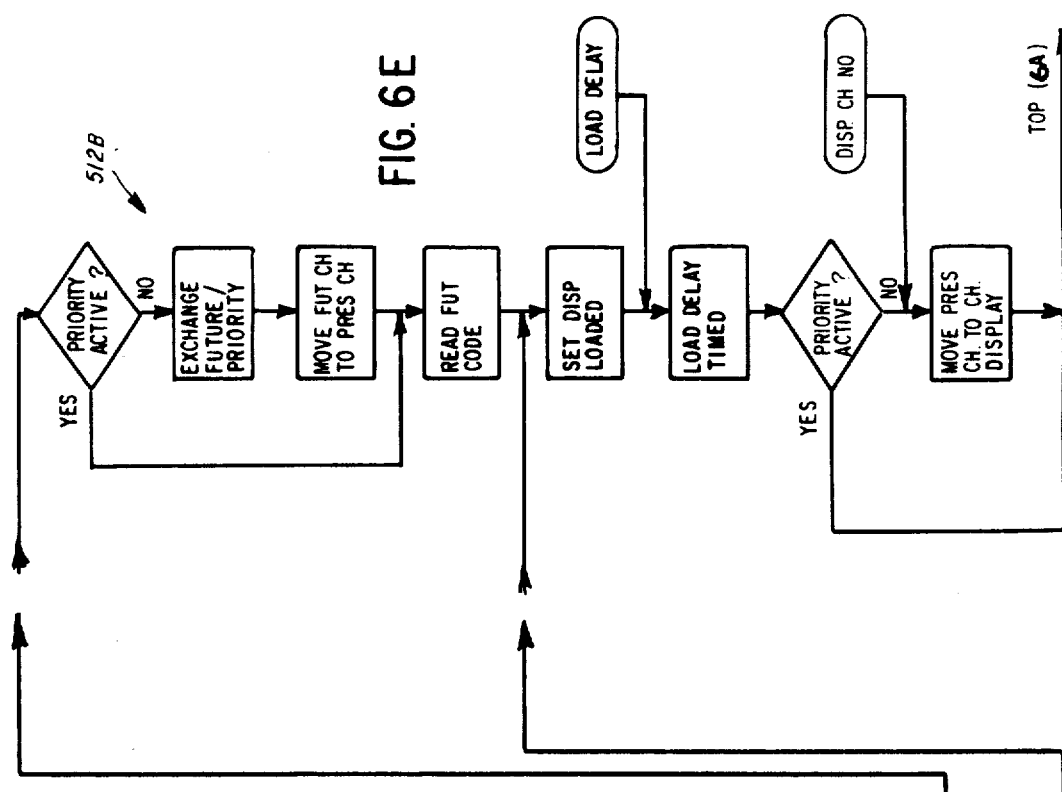

In FIG. 6A, reference numeral 510 designates a portion of the main routine in which the display is refreshed until an interrupt is detected. If an interrupt is detected, there is an update of a record of a signal present status, recording the signal as of a time of the interrupt. Then a priority active test is made and if the system is in the middle of a priority sample, or if not and if no priority has been selected for the present channel, the system goes on to routines for manual or scan or search modes as shown in FIGS. 6B and 6E. Also, if after a decrement or update of the priority timer, it is found that the time for the priority routine has not occurred, then the entire system may go on to the routines of 6B and 6C and/or FIGS. 6D and 6E.

However, if priority has been selected for the current channel and if it is time for the priority routine, it is followed as shown in the lower portion of FIG. 6A. After initializing a priority timer, the system outputs a stored priority code to the synthesizer to tune the receiver to the priority frequency. Then after resetting display loaded, setting priority active, removing the audio mute and loading a delay timer, a test is made as to whether there was a signal present as of the time of the interrupt. If so, and if the system is in the manual mode, the system returns to the initial starting point. If there was no signal present and if a halt mode is not a factor, the system also returns to the initial point at the top of the chart in FIG. 6A.

However, if a signal was present and manual mode is not selected or if with no signal present, the halt mode is selected, the system loads a future register from the display and then moves the present channel data to the future channel register, then returning to the initial point. Thus, a frequency displayed at the time of the priority sample is saved in a future register. This portion of the routine is important in allowing use of the find future routine while also allowing the user to give a particular channel a priority status.

In FIGS. 6B and 6C, reference numerals 511A and 511B generally designate portions of the main routine which are followed when the system outputs a future code. When there is no signal present, the high speed flag is tested. If low speed is selected, the system outputs the future code every third interrupt as compared to the high speed operation which the system outputs the future code every interrupt.

The system may also output the future code in response to a "CONTINUE" signal developed under certain conditions following closure of "SCAN, LOCK-OUT, SEARCH, PRIORITY" key switches. Such conditions are defined by flow charts on key action routines as described hereinafter effective to reset a halt circuit, load a delay timer and then output the future code. It is noted that the routine forces an immediate resumption, without delay or slow speed, when locked onto a channel because of a halt, signal present, etc.

A "DOUBLE CONTINUE" signal may be effective in a similar manner after setting a double flag and loading the future channel from the present channel. The "DOUBLE CONTINUE" signal is derived from a routine following operation of the scan key and the routine is used to initiate a scan. The continue routine is executed twice, first to find the next future code and then again to output that code and find the next. During the first time through, an output of the future code serves no purpose other than to re-sync the interrupt clock which is critical because the scan portion of find future assumes that such has been done. The future channel must be set equal to the present channel at the beginning of double continue to avoid a possible lock-up in the first part of find future scan.

After the system outputs the future code, it resets priority active, clears the mute signal, finds a future code and then resets display clear. It is noted that display clear cannot be reset at an earlier time because it is tested to find future, as hereinafter clarified.

Figure 6D:
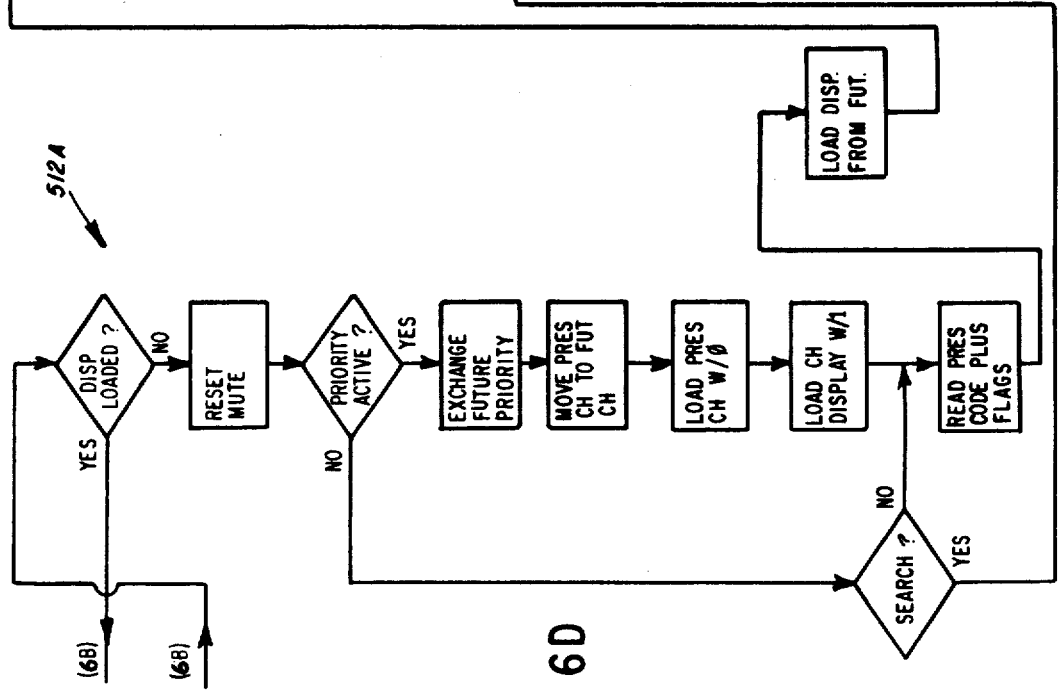

In FIGS. 6D and 6E, reference numerals 512A and 512B generally designate portions of the main routine which may be described as a signal present routine. In the presence of a signal and when the display is not loaded, the mute is removed, if set, and if the priority is active, the priority data is moved to future, saving the future data, the present channel is saved in the future channel and the channel is loaded with the priority data. Then a present code is read, wiping out the future code and bringing in the lock-out and delay flags. If the priority is active, the system restores present channel, exchanging future with priority. Present channel is left in future so that after a priority signal is present, the next channel to be scanned will be the former present channel.

Next, the display is loaded from the present code and the future code is restored to future, display loaded being then set and a delay timer being then loaded. If at this point, priority is not active, the system moves the present channel to the display channel. However, if the priority is active and thus the display channel is already loaded, it is left undisturbed.

It is noted that the last operation may be performed in response to a "DISPLAY CHANNEL NUMBER" signal which may be applied following operation of the manual, marine and aircraft keys. This routine which provides a jump to the top, first loads the channel number portion of the display.

It is also noted that the display timer may be loaded in response to a "LOAD DELAY" signal which may be developed from the find future routine under certain conditions. This routine provides a jump to the top after first loading a delay timer and also the channel display.

Figure 7B:
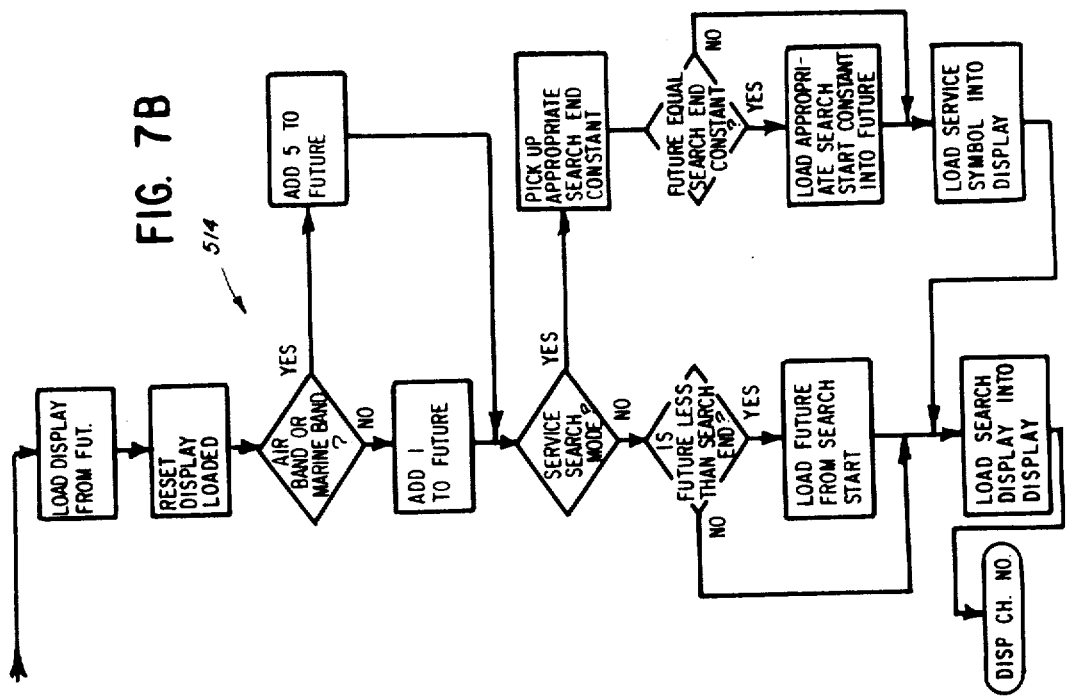
FIGS. 7A and 7B together provide a flow chart for a find future routine used in a processor circuitry of FIG. 5.
Figure 7A:
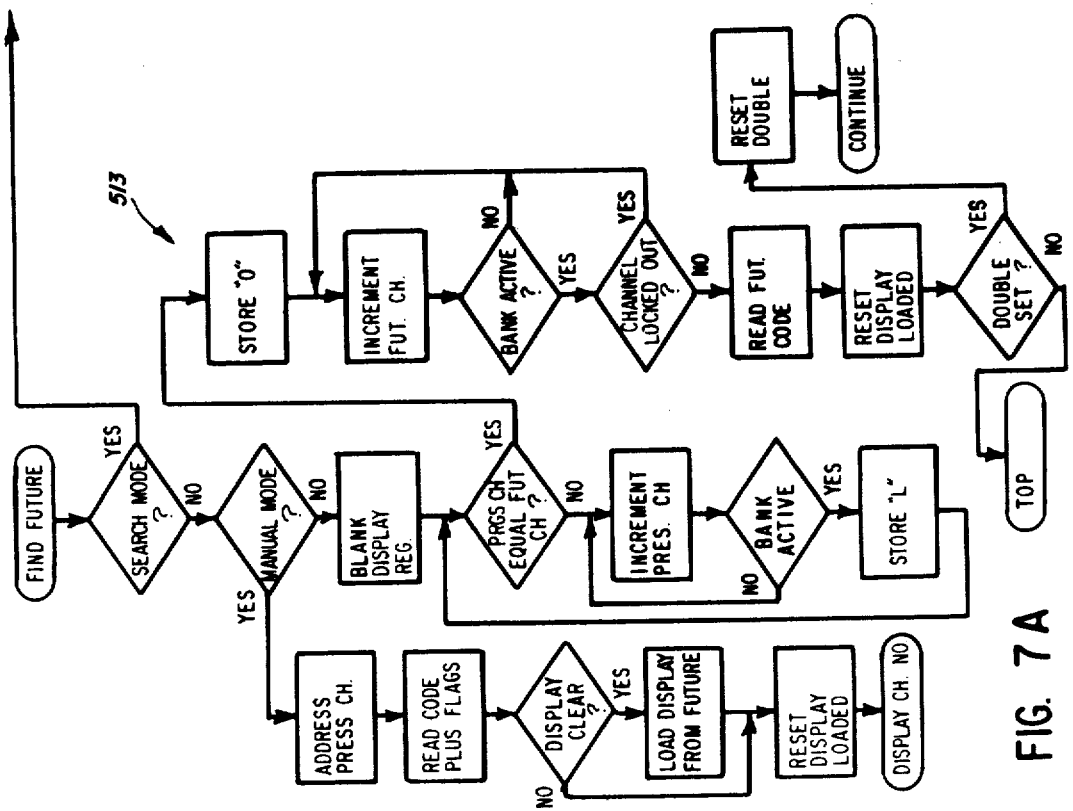
Figures 8, 9, 10:
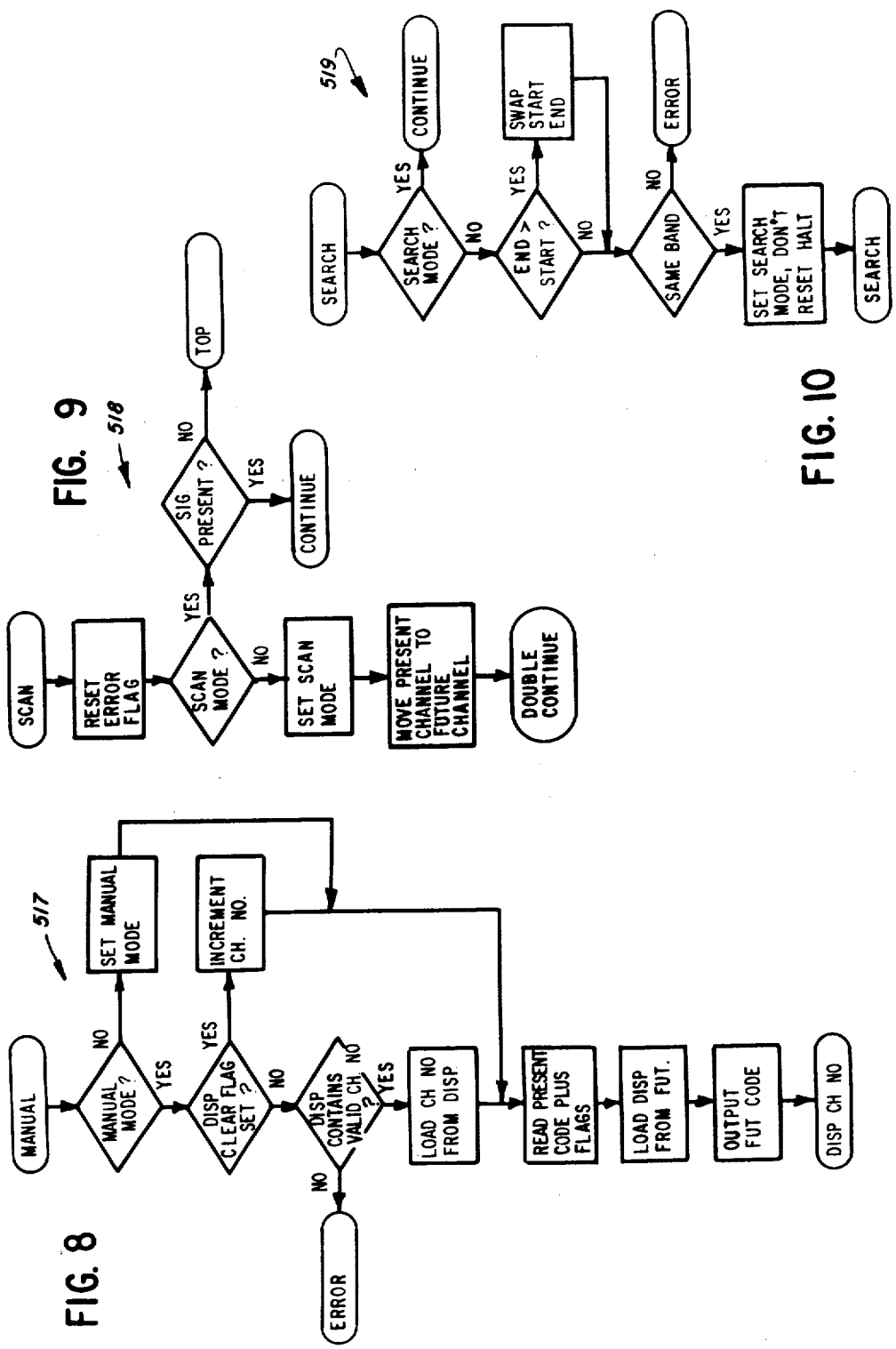
FIGS. 8 through 19 provide flow charts respectively showing key action routines which take place following operation of a manual key, a scan key, a search key, a marine key, an aircraft key, a priority key, numeric keys, an enter key, a limit/hold key, band keys, a lock out key and a delay key.
Figure 13:
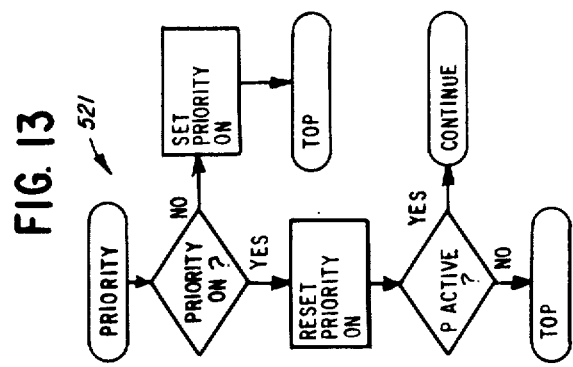
Figure 12:
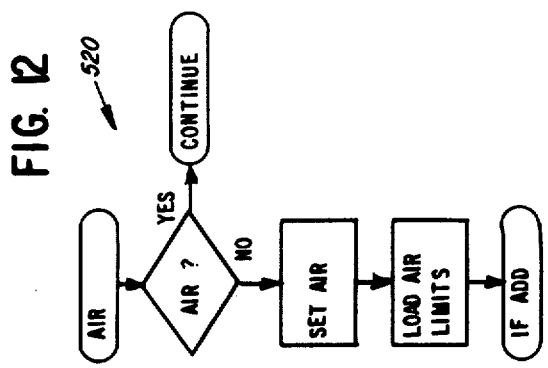
Figure 11:
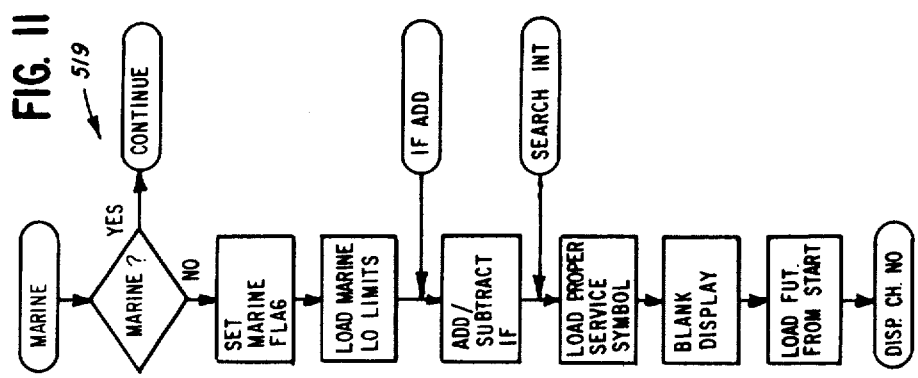
Figure 17:
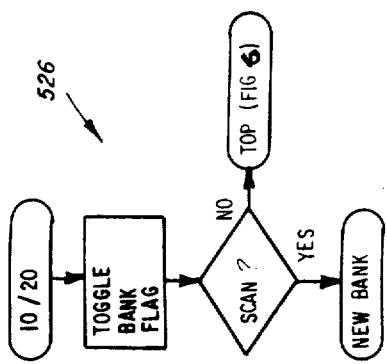
Figure 16:
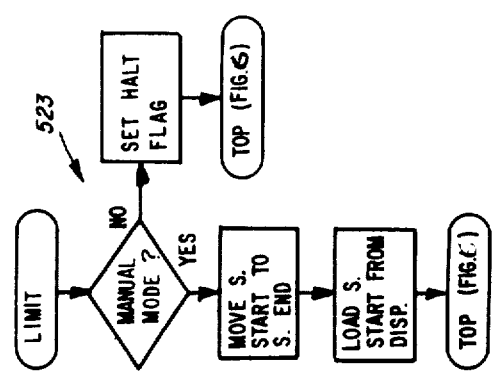
Figure 15:
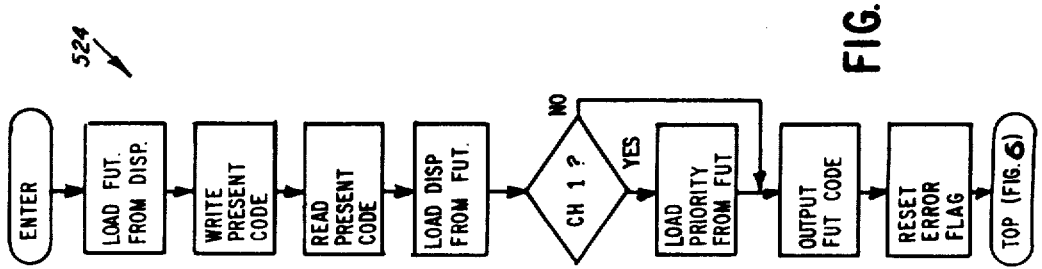
Figure 14:
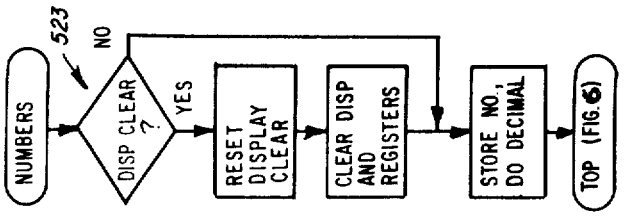

Referring to FIG. 7A, reference numeral 513 generally designates portions of a find future routine, followed in manual and scan modes, find future routines in search and service modes being illustrated in FIG. 7B. It is noted that in the manual mode, the find future routine will only be executed after a priority sample. Delay and lock-out flags from memory are loaded into the display in case they were erased by a signal present on priority. If the display was clear (i.e., the user had not entered a number), it is loaded with the proper frequency, otherwise it is left alone so that any number the user may have entered is not erased.

In connection with the incrementing of the present channel, it is noted that this operation is performed until it equals the next unlocked future channel, and "L" is stored in the proper digit for each intervening channel. If the present channel is equal to the future channel, a zero is stored in place of the last "L" and then the future channel is incremented until an unlocked channel is found.

The bank active test is performed to determine if an interrupt has occurred. Normally, the loop will finish long before an interrupt is due, provided that the interrupt clock has just been re-synced by the output future code routine. If an interrupt is detected, it is assumed that the loop is endless and that the processor is hung up. When this happens, the system moves the program into the manual mode.

In FIG. 7B, reference numeral 514 generally designates portions of the find future routine used in the search and service modes. Initially, the display is loaded from the future register so that the display contains the frequency that has just been output to the synthesizer. Then display loaded is reset and a test is made as to whether one or the other of the air or marine bands has been selected. If so, five "1" digits are subtracted from the future channel code to cause incrementing by 25 KHz, it being noted that every "1" subtracted from synchronizing code represents an increase in 5 KHz when operating in the A band and in the H band which includes the marine band, as well as in the low band. If neither the aircraft band nor the marine band has been selected, "1" digit is subtracted from the future code, incrementing by 5 KHz being proper for most bands.

Then another test is made as to whether a service search mode has been selected. If so, an appropriate search end constant is read from a table and the test is made as to whether the future code is less than the search end constant. If it does, the appropriate search start constant is loaded from the table into future. The service symbol is loaded into display and then a search delay is loaded into the display channel, the channel number then being displayed.

If the service search mode is not selected, a test is made to determine whether the future code is less than the search end limit. If not, the search delay is loaded into the display and the channel number is displayed. If future is less than the search end limit, future is first loaded from search start.

In this routine, the service symbol and/or the delay symbol are reloaded in case they are erased from the display by a signal present of priority.

The find future routines take place concurrently with the operation of the synthesizer in tuning to a new frequency, conditioning the system so that it is ready to output a new code if no signal is received.

The control of the incrementing finder is important in effecting a rapid scan through the service bands which contain a large number of channels.

FIGS. 8 through 19 illustrate key action routines. In these figures, reference numerals 517 through 528 respectively designate routines which follow operation of the manual key 43, the scan key 44, the search key 53, the marine key 51, the aircraft key 52, a priority key 46, the numeric keys 30–39, the enter key 42, the limit/hold key 54, "10" or "20" keys 49, 50, a lock-out key 48 and the delay key 47.

A "CONTINUE", "DOUBLE CONTINUE", "DISPLAY CHANNEL NUMBER" and other signals produced from the routines shown in the charts of FIGS. 8–19 are applied as indicated in the main routine flow chart of FIGS. 6A, 6C, 6D and 6E and the find future flow charts of FIGS. 7A and 7B.

Figure 20:
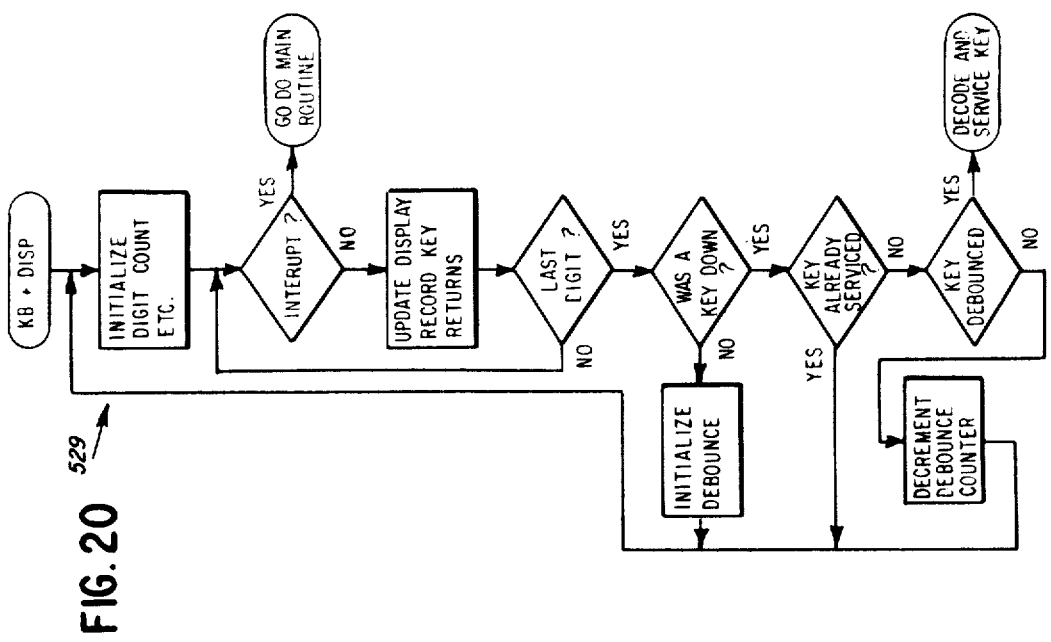
FIG. 20 provides a flow chart showing portions of the routine followed in the processor in connection with keyboard and display portions of the receiver.
Figure 19:
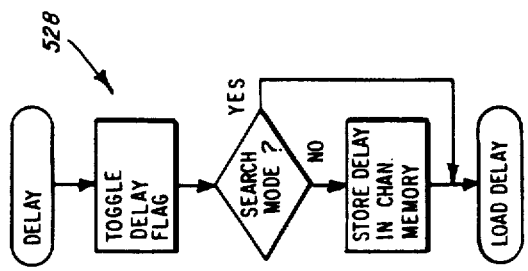
Figure 18:
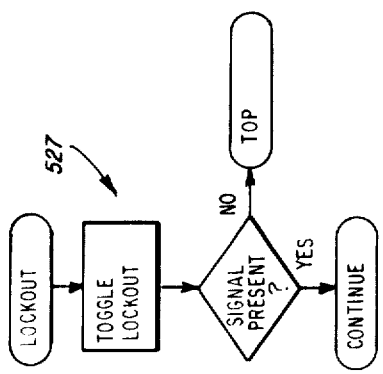

In FIG. 20, reference numeral 529 designates portions of the routine followed in connection with the keyboard and display.

Figure 21:
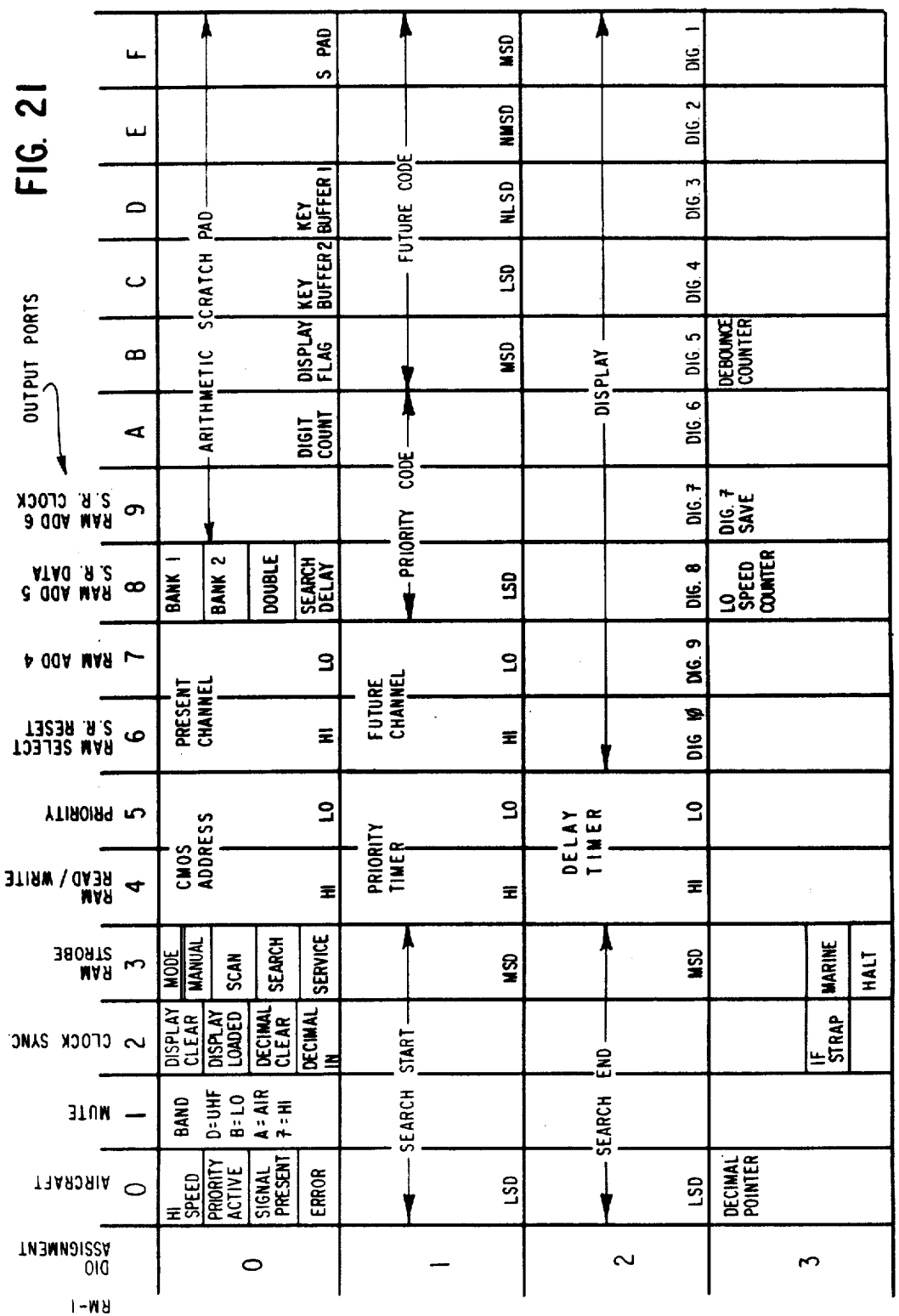
FIG. 21 is a chart constituting a map of the memory of the processor circuitry of FIG. 5.

FIG. 21 is a chart constituting a map of the memory of the processor circuitry organized into four columns with 16 words in each column, four bits in each word. In the 00 address location, labeled "FLAGS", a high speed flag is set for performance of a scan or search at the high speed when set. A "priority active" flag is provided which is set during a priority sample and which indicates that the synthesizer contains the priority code. A "signal present" internal flag is provided that represents the state of the signal present input. An error flag is set whenever "Error" is to be displayed, it being noted that "Error" is never actually written into the display register.

A 01 memory address, labeled "BAND" contains a code that indicates the band of either the future code or the display frequency.

The 02 memory address, labeled "FLAGS" contains a "DISPLAY CLEAR" flag that indicates that the user has not entered a number. A "DISPLAY LOADED" flag which is a mainline routing flag indicates that display has been loaded with frequency, etc. during signal present. A "DECIMAL/CLEAR" flag keeps track of how many times the decimal/clear key has been pressed and a "DECIMAL IN" flag indicates that a decimal point is in the display.

Memory address 03, labeled "MODE", indicates the operating mode. Bits 1 through 4, respectively, indicate the manual, scan, search and service modes, bit 4 being set in conjunction with bit 3.

Memory addresses 04 and 05 contain addresses for an external memory into which data may be entered such as that produced from operation of the numeric keys.

Memory addresses 06 and 07, labeled "PRESENT CHANNEL" indicate the channel that the system is presently on (0-19).

Memory address 08, labeled "FLAGS" contains flags "BANK ONE" and "BANK TWO", respectively, indicating that bank one or bank two is active. "DOUBLE" is a mainline routing flag indicating that a "DOUBLE CONTINUE" must be executed, i.e., that the next future code must be found and output to the synthesizer and that the next code after that must be found. "SEARCH DELAY" indicates when a delay is selected for the search.

Memory addresses 09-0F, labeled "SCRATCH PAD", contain an arithmetic scratch pad and also contains several temporary registers used by the display routine.

Memory addresses 10-13 labeled "SEARCH START" contain the code for the lower search limit.

Memory addresses 14, 15, labeled "PRIORITY TIMER", count the number of interrupts to determine when a priority sample is due.

Memory addresses 16, 17, labeled "FUTURE CHANNEL" indicate the next channel to be scanned (0-19).

Memory addresses 18-1B, labeled "PRIORITY CODE", contain the same code as is in channel 1 in the memory, it being kept in a register for quick access.

Memory addresses 1C-1F, labeled "FUTURE CODE", contain the next code to be output during scan and search modes. During manual mode, it contains the present code that the user is looking at or listening to.

Memory addresses 20-23, labeled "SEARCH END", contain the code for the upper search limit. This register, along with the search start, is also used to hold the limits as they are entered until they can be tested to find which is upper and which is lower.

Memory addresses 24, 25, labeled "DELAY TIMER", counts the number of interrupts to determine when the delay time has elapsed.

Memory addresses 26-2F, labeled "DISPLAY", contain the data for refreshing the display.

Memory address 30, labeled "DECIMAL POINTER", indicates which digit the decimal point should appear in.

Memory address 31, labeled "FLAGS", is an IF strap which indicates which frequency, 10.8 MHz or 10.85 MHz, has been selected.

Memory address 33, labeled "FLAGS", contains a "MARINE" flag which indicates when a marine service search is called for and contains "HALT" which indicates when a search is on hold.

Memory address 38, labeled "LO SPEED COUNT", counts the number of interrupts to determine when to continue scanning of searching.

Memory address 39, labeled "DIG. 7 SAVE", is a save register for digit 7.

Memory address 3B, labeled "DEBOUNCE COUNT", counts the number of keyboard strobes to determine when the debounce time has elapsed.

The code computation routines are important in connection with the operation of the processor and synthesizer circuitry. The conversions between synthesizer codes and display frequency are done by two sub-routines "LOAD FUTURE FROM DISPLAY" and "LOAD DISPLAY FROM FUTURE". Both of these routines utilize several second-level subroutines.

The "LOAD FUTURE FROM DISPLAY" routine first corrects the display by adding leading and trailing zeros, if necessary. Next, the frequency is tested to be sure it is within band limits and the proper band code is loaded into band. The band code is required for later computations. The code is computed by first adding or subtracting the proper IF, depending upon the band. The frequency is then multiplied by 2,000 by dropping the decimal and adding the frequency to itself. If it is within the UHF band, it is also multiplied by 0.4. Then it is divided by 10, converted to binary hexidecimal and complemented.

The "LOAD DISPLAY FROM FUTURE" routine first loads band with the proper band code, then complements the code and converts it to BCD. The necessary multiplication is incorporated in the conversion by multiplying the conversion constant by either 50 or 125, according to the following table.

| Standard-Hex-To-BDC Conversion Factor | Lo/Air/Hi Band Conversion Factor (× 50) | UHF Band Conversion Factor (× 125) |
|---|---|---|
| 1 | 50 | 125 |
| 16 | 800 | 2000 |
| 256 | 102800 | 32000 |
| 4096 | 204800 | 512000 |

The result of the conversion is divided by 10,000 by shifting the display to the right one place and inserting the decimal point. Finally, the proper IF is added or subtracted. With this operation, the proper conversions can be made for output to the synthesizer and for converting back to a proper code for display when necessary.

It is noted that the first three most significant digits of the aircraft and high band codes are the same when such are applied to a synthesizer which creates no problem in connection with the synthesizer. However, for developing the A-band signal for application to the detector circuits, through line 82, an ambiguity must be avoided and for this purpose, the aircraft codes are offset by subtracting 8,000. Aircraft codes can thus be distinguished by examining the most significant digit which will be less than 3. A factor of 8,000 is then added to all aircraft codes before performing an operation such as "Output Code" or "Load Display From Future".

The channel data are stored in an external memory which may preferably be a CMOS memory and which may be a programmable read only memory operative in a manner such that data entered therein can be erased but at the same time can be stored indefinitely so that a program, once entered into the memory by the user, will be preserved when the receiver is disconnected from a voltage source.

The channel data are stored in the memory in five four-bit nibbles. The first nibble contains the lockout and delay flags. The remaining four nibbles contain the synthesizer code, beginning with the least significant nibble. In order to read the data for a particular channel, the channel number must be multiplied by five to obtain the proper address. The first memory location in the memory is not used in an actual embodiment because of a power-on problem that accidentally wrote into the first location. A sub-routine address "PRESENT/FUTURE CHANNEL" performs the necessary computations and stores the result in a memory address. The sub-routine's "READ" and "WRITE" utilize this address and perform the actual data transfer between the accumulator and the memory. "READ CODE" and "WRITE CODE" are higher level sub-routines that utilize "READ" and "WRITE" to transfer the four nibbles of the synthesizer code between the memory and the future code register. "READ CODE PLUS FLAGS" is a modification of "READ CODE" and also loads the display according to the lock-out and delay flags.

Figure 22:
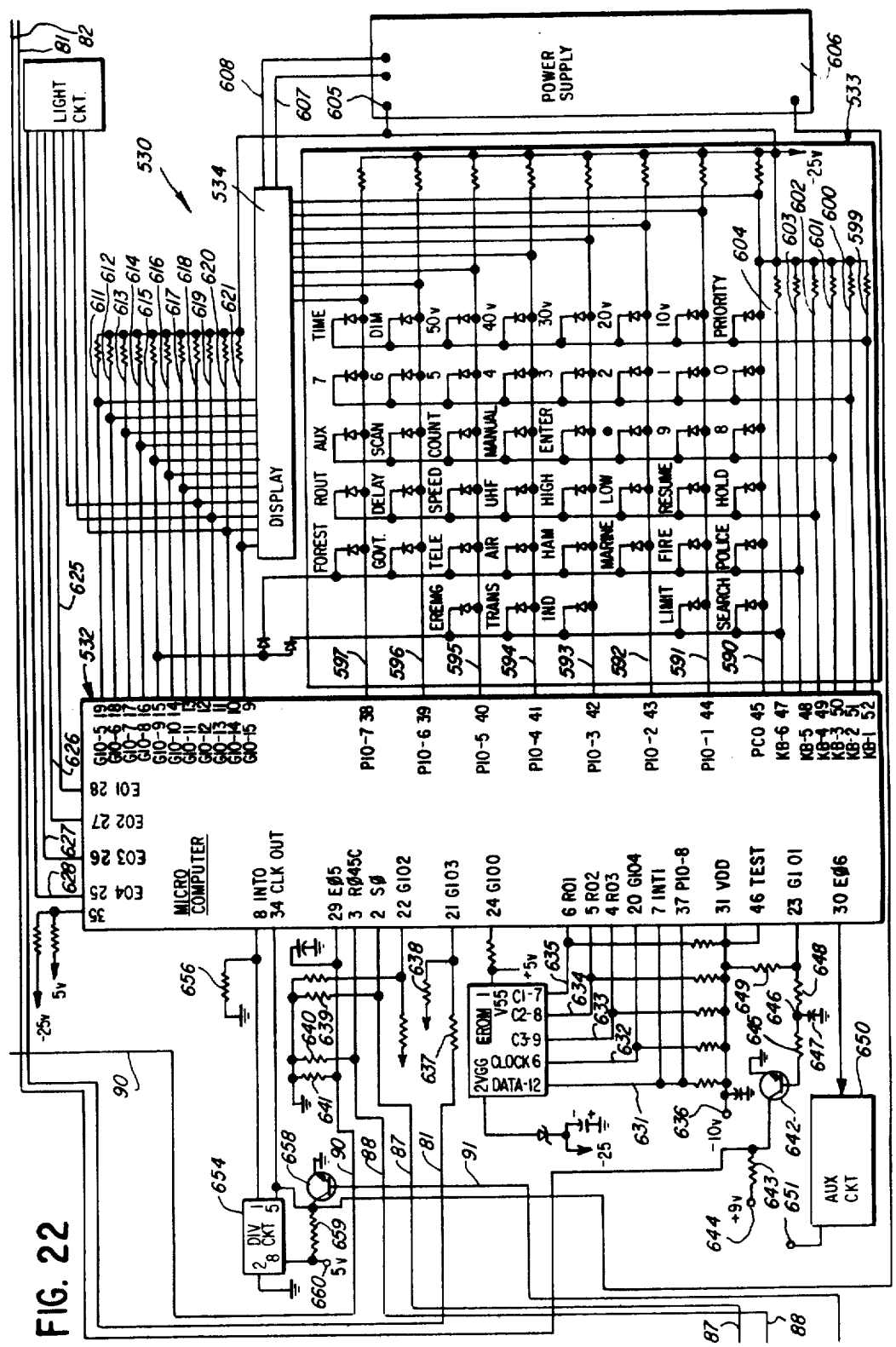
FIG. 22 is a schematic diagram of another form of processor circuitry in accordance with the invention.

FIG. 22 is a schematic diagram of another preferred form of keyboard, display and processor circuits, generally designated by reference numeral 530. The circuits include a single-chip microcomputer 532 which is manufactured by the Microelectronics Group of Rockwell International Corporation and designated as A91XX. The microcomputer 532 includes a central processing unit, a read-only memory, a random access memory, general purpose input/output buffers and latches.

Figure 23:
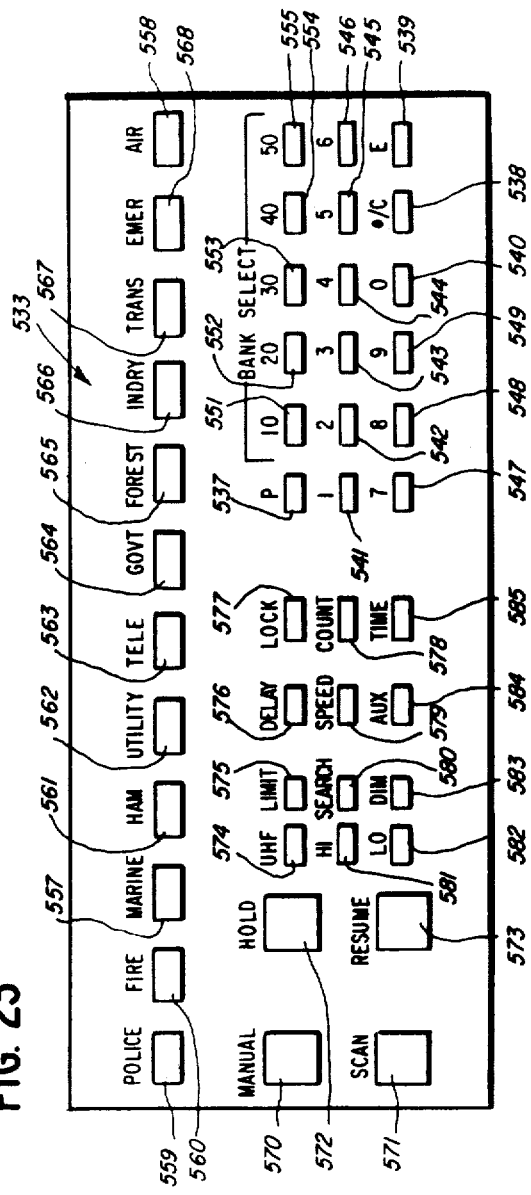
FIG. 23 is a plan view of a keyboard used in conjunction with the processor circuitry of FIG. 22.

The microcomputer 532 is connected to a keyboard 533 and a display 534 which are generally similar to the keyboard 26 and display 29 as illustrated in FIGS. 2 and 3. FIG. 23 shows the arrangement of keys of the keyboard 533. A program section 536 includes a priority key 537, a decimal point key 538, and enter key 539. Numeric keys 540–549 are provided and there are five bank select keys 551–555 for selection of five different banks labeled, "10", "20", "30", "40" and "50", each having ten channels.

The keyboard 533 further includes marine and aircraft keys 557 and 558 for searching through the marine and aircraft bands. A number of additional service search keys are provided, including keys 559–568 for searching through police, fire, amateur (HAM), utility, telephone, government, forestry, industry, transportation and emergency bands.

Keyboard 533 further includes a manual key 570, a scan key 571, a hold key 572, a resume key 573, and keys 574–585, respectively designated as "UHF", "limit", "Delay", "lock", "Count", "Speed", "Search", "Hi", "Lo", "Dim", "AUX" and "Time" keys.

The manual key 470, scan key 571, delay key 576, lock key 577, speed key 579, and search key 580 are for purposes similar to those of the corresponding keys of the keyboard 26, described hereinbefore. The count key 578 is active in a manual mode and is for the purpose of causing the display 534 to indicate the number of times that a current channel has been active since the counter was last cleared or since a new frequency was entered into the channel.

The hold key 572 performs one of the functions of the limit/hold 54 of the keyboard 26 and is active in search modes, including service search modes, to cause the sequencing of frequencies to halt and to cause the receiver to be active on the current frequency. Successive closures of the key 572 causes manual sequencing of search frequencies, one at a time. The selection of a current service search mode cancels a hold command.

The resume key 573 is active only in search modes after selection of hold by operation of the hold key 572, operating to cancel the hold command. The receiver then contains sampling of service of frequencies. However, it is noted that in performing the service searches with the keys 557–568, it is possible to search carefully through each category and make certain that no frequency will be missed. In connection with the service search operations, some of the service search categories include frequencies in two or three of the bands and in some cases, the user may wish to search only through the frequencies in one of the bands. In this case, the user can operate the UHF, HI and LO keys 574, 581 and 582 during a service search operation and select and deselect by toggle action each of the three sets of frequencies for each of such bands. The status is indicated on the display 534 as hereinafter described.

The dim key 573 causes all lighted display indicators to operate at reduced intensity for best eye comfort in a dark environment.

The "AUX" key is used to program for production of an auxiliary output function when a signal is present on a certain channel. During the manual mode, it is operated to program the current channel for development of the auxiliary output signal when the signal is present thereon.

The time key 585 is operable for displaying the time on the display 534.

Figure 24:
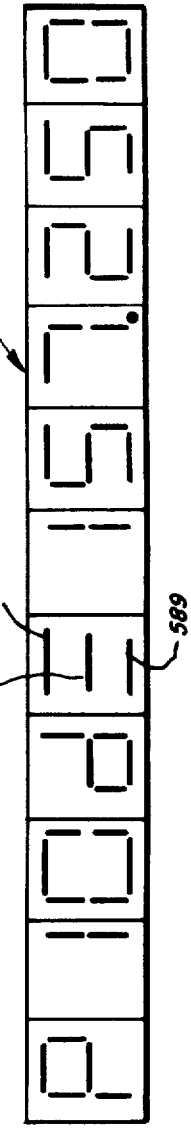
FIG. 24 is a plan view of a display used in conjunction with the processor circuitry of FIG. 22, showing indications obtained in one mode of operation.

The appearance of the display 534 as shown in FIG. 24 is similar to that of the display of 29 shown in FIG. 3. One difference relates to operation in the service search modes in which, as aforementioned, when a service category has frequencies in more than one band, the user can operate the UHF, HI and LO keys 574, 581 and 582 to select and deselect any one of the bands. The display 534 indicates the status of such frequencies in the fifth window from the left. As shown in FIG. 24, three vertically spaced horizontal bars 587, 588 and 589 appear which respectively indicate the UHF, H and L bands. Initially, all three bands are selected and all three of the horizontal bars 587, 588 and 589 will appear.

The microcomputer 532 is similar to the microcomputer 410 but has higher storage capacity in its memories. It includes a ROM having a 4096×8 capacity and a RAM having a 192×4 capacity. It also has internal circuitry which performs the same function as the shift register and flip-flop circuits 449 and 450 in strobing the keyboard and display. As indicated in FIG. 25, each key operated switch of the keyboard 533 has one contact connected to one of eight lines 590–597 which are connected to parallel input/output ports of the microcomputer 532 and each key operated switch has a second contact connected to one of six lines 599–604 which are respectively connected to "KB1" through "KB6" keyboard returns or discrete inputs of the microcomputer 532. All of the lines 590–597 and 599–604 are connected through resistors to a minus 25-volt terminal 605 of a voltage supply 606.

The lines 590–597 are also connected to input terminals of the display 534 which is a vacuum fluorescent display operated from the terminal 605 of the voltage supply 606 and also supplied with filament voltage therefrom through lines 607 and 608. The display 534 has eleven input terminals connected through lines 611–621 to general purpose input/output ports G10-5 through G10-15 of the microcomputer 532, also connected through resistors to the voltage supply terminal 605.

Lights may optionally be provided for indicating the operation of the service search keys and for selective operation of such lights, a circuit 624 is provided which is connected to lines 618–620 through lines 625–628 to "Extended Output" terminals E01-E04 of the microcomputer 532.

An erasable or programmable read only memory 630 is provided for storing channel information, count bits, lock-out and other functions when the receiver is disconnected from a supply voltage source. The memory circuit 630 includes data, clock and control terminals 631–635 respectively connected to an interrupt terminal, a general purpose input/output terminal and three register output terminals of the microcomputer 532, all terminals being connected through resistors to a voltage supply terminal 636 which is connected to a voltage supply input terminal of the microcomputer 532.

The control signal developed on line 81 by the squelch circuitry is applied through a resistor 637 to another general purpose input/output terminal of the microcomputer 532 which is also connected through a resistor 638 to the voltage supply terminal 636.

Data and clock signals for serial transmission of the frequency code to the synthesizer circuit through lines 87 and 88 are developed from serial output and serial clock terminals of the microcomputer 532 which are connected through resistors 639 and 640 to ground. The mute signal on line 90 is developed on an extended output terminal which is connected through a resistor 641 to ground.

The A band control signal on line 82 is developed at the collector of a transistor 642 which is connected through a resistor 643 to a plus 9 supply voltage terminal 644. The emitter of the transistor 642 is connected to ground while the base thereof is connected through a resistor 645 to a circuit point 646 which is connected through a capacitor 647 to ground and which is connected through a resistor 648 to a general purpose input/output terminal of the microcomputer 532, the terminal being also connected to a terminal 649 to the power supply terminal 636.

A circuit 650 is provided for developing an auxiliary output signal at a terminal 651. The circuit 650 may be similar to that used to develop the A band control signal and has an input connected to an extended output terminal of the microcomputer 532.

A circuit 654 is provided for developing an interrupt signal which is applied through a line 655 to an interrupt terminal of the microcomputer 532, the interrupt terminal being connected through a resistor 656 to ground. The circuit 654 may be a divided-by-54,167 circuit which is supplied with an input signal at a frequency of 867 KHz to develop an output signal at about 16 Hz. A terminal of the circuit 654 is connected to a clock select terminal of the microcomputer 532 and is also connected to the collector of a transistor 658 which is connected through a resistor 659 to a +5 volt voltage supply terminal 660. The emitter of the transistor 658 is grounded while the base thereof is connected through the line 91 to the oscillator and frequency synthesizer circuits 71. In this case, the line 91 may be coupled within the circuits 71 to circuitry which supplies a 867 KHz signal. The collector of the transistor 658 may also be connected through a line 661 to the power supply circuit 606 which may include divider circuit operative to develop a 25 KHz signal which is amplified and rectified to develop the supply voltage for the vacuum fluorescent display 534.

The operation of the processor 530 is similar to that of the processor of FIG. 5 and the overall program flow is substantially the same. However, the find future routine is expanded for the service search operations, many bands in addition to the aircraft and marine bands being provided.

FIG. 25 is a flow chart illustrating a load future service search routine incorporated in the system 530 and generally designated by reference number 666.

When a service search key is pressed, a number uniquely associated with that service is loaded into a service selector register. The service selector is examined in a "find future" routine to determine which service search, if any, is to be performed. Once a proper search is determined, the processor accesses the appropriate set of tables and reads the next table entry as described below.

Each service search has up to three frequency tables associated with it, one table for each band. Attention is invited to the foregoing discussion of the operation of the UHF, HI and LO keys 574, 581 and 582. After running through a table, the processor tests the band disable flag associated with the proper band key to see if the next band is deselected. If it is, the processor proceeds to the next table and tests the flag for it.

The band disable flags are set by the processor to the appropriate state when a service search is first selected. The flags can then be modified by the user through use of the band keys 547, 581 and 582. The processor tests if the user has selected an invalid band, in which case the key is ignored, or if all bands are deselected, in which case the processor selects all appropriate bands.

The frequency tables contain two different types of data that are distinguishable by examination. The first type is a frequency code. If the processor determines that the data read is a frequency code, the code is transferred to the future code register.

The second type of data is an increment/count. The processor breaks this data word into two parts, the increment constant and the repeat count. The increment is added to the number already in the future code register to obtain a new future code. After the future code has been output to the synthesizer, the future code is again incremented. The process is repeated many times as is indicated by the repeat count. When the process is done, the next entry is read from the frequency table. A special data word is included as the last entry of the table to indicate the end. The processor then accesses the next table as described above.

It is noted that each service band may thus include a plurality of sub-groups, each including frequencies differing from one another by a certain incremental value with limit frequencies of the sub-groups being identified by the frequency code data portions and with the numbers of frequencies in the sub-groups being identified by the count data portions. The end of a final one of the sub-groups is indicated by the special data word to signify completion of the scanning of the service band and, at this point, a repeat scanning of the band is initiated in the absence of a signal on the signal presence line of the detector circuit.

It is noted that in some cases, a sub-group may consist of a single frequency in which case the processor proceeds to the next frequency code without the incrementing operation.

In FIG. 24, reference 667 designates a key action routine for the police band, being a typical key action for all service search keys. In FIG. 28, reference numeral 668 designates the key action routine for the "HI" band key which is simply applying a signal to toggle the high band in band select.

With the operation as described and illustrated, the required memory capability of the microcomputer is greatly reduced. It is noted that although the frequencies in the service bands are not typically in regular frequency difference intervals, there are sub-bands which do have frequencies at regular intervals between lower and upper limits, such that a very significant reduction in the memory requirement can be obtained through the described operation of the processor.

The hexidecimal language which implements the functional description for the operation of the aforementioned Rockwell MM78L and A9100 microcomputers 410 and 532 are set forth in Tables I and II below.

TABLE I

| Addr | | | | | | | | | | | | | | |
|---|---|---|---|---|---|---|---|---|---|---|---|---|---|---|
| 0000 | 70 | 71 | 10 | 48 | 22 | 60 | 26 | 29 | E1 | 15 | 00 | 01 | 3D | FF | 13 | 2B |
| 0025 | EA | 0B | 2B | EA | 10 | 2A | 3E | FF | 15 | 0A | 05 | 4F | 7C | 5B | 4F | 7C |
| 0009 | 5C | 02 | F0 | 40 | 54 | 40 | 5C | 02 | CA | 10 | 28 | CA | 18 | 0B | 4F | 03 |
| 0019 | 7D | 42 | 5C | 02 | 3A | FF | 34 | A1 | 10 | 25 | 3C | FF | 12 | 25 | EA | 16 |
| 0040 | 12 | 29 | E6 | 11 | 71 | 10 | 29 | D5 | 13 | 2A | ED | D0 | 92 | 40 | 54 | 40 |
| 0065 | 5E | 41 | 50 | 4F | 5C | BF | 94 | BB | 10 | 29 | C2 | D8 | 17 | 09 | 89 | 30 |
| 0049 | 81 | AF | 12 | 21 | 18 | 0A | 29 | 40 | 42 | 14 | 0A | 54 | 40 | 5C | 10 | 29 |
| 0059 | 3A | FF | 30 | 33 | EA | 35 | 9D | EE | 35 | 9D | 17 | 09 | 09 | ED | 00 | 00 |
| 0080 | 15 | 09 | 05 | 4F | 7C | 58 | 4F | 7C | 5C | 02 | 3F | EB | 42 | 54 | 40 | 5C |
| 00A5 | 34 | BF | 12 | 25 | 14 | 0A | 40 | 54 | 40 | 5C | 10 | 21 | 2A | C4 | 13 | 08 |
| 0089 | 2B | CB | 3A | FF | 8F | B9 | 92 | ED | 13 | 28 | ED | CB | 00 | 6F | 61 | 00 |
| 0099 | 5C | ED | 15 | 06 | 48 | 7C | 58 | 40 | 7C | 5C | 2F | 16 | 9A | 17 | 86 | 2F |
| 00C0 | 13 | 28 | 30 | 38 | FA | 2A | 3B | FF | 16 | 0A | 4F | 54 | F9 | 10 | 0B | 4F |
| 00C5 | 5F | 27 | 12 | 25 | 17 | 51 | 7F | CA | 16 | 51 | 7F | CA | 06 | BA | A8 | 16 |
| 00C9 | 09 | 30 | 38 | 9B | D8 | 30 | 81 | 00 | BE | 1F | 5C | 28 | D8 | 98 | 18 | 2B |
| 00D9 | D4 | 3A | FF | 27 | 3B | C5 | A1 | 16 | 30 | 38 | 9B | CA | 05 | BA | E1 | 00 |
| 0100 | BB | D3 | 4A | 7F | 4E | 4A | 13 | 2B | F9 | D7 | 0B | 2A | 4A | 1C | 09 | 05 |
| 0125 | C6 | 4F | 7C | 54 | CD | CB | 06 | 10 | 0A | 53 | 77 | 7C | 5C | 57 | 30 | 44 |
| 0109 | DD | 02 | D9 | E4 | 13 | 2B | 30 | 34 | FF | AD | E8 | C1 | 35 | 87 | AD | 39 |
| 0119 | E4 | 12 | 25 | 11 | EF | FF | 27 | 12 | 00 | 13 | 0B | 27 | 14 | 0A | 3F | D6 |
| 0140 | 78 | 1F | 5C | 28 | DE | 00 | 84 | 16 | 70 | 18 | 70 | 1A | 01 | CD | 70 | 3F |
| 0165 | FE | 10 | 2B | 33 | DB | 1A | 50 | 77 | 7A | 0A | 50 | 2C | 00 | 00 | 41 | 4F |
| 0149 | 42 | 46 | 4C | 44 | 40 | 4F | 40 | 44 | 48 | 4E | 41 | 42 | 4F | 4F | 75 | 39 |
| 0159 | FF | 1F | 0A | 58 | 30 | 49 | D4 | 2F | 16 | 71 | 70 | 10 | 20 | 13 | 42 | 5C |
| 0180 | 1A | 50 | 68 | DC | 50 | 10 | 0B | 06 | 7F | 05 | DB | 05 | 13 | 29 | FA | 1B |
| 01A5 | 6F | D0 | 29 | 06 | DB | 28 | 06 | DB | 16 | 6F | D8 | 28 | 06 | DB | 28 | D8 |
| 0189 | 06 | 38 | FF | AD | 35 | 87 | E4 | 13 | 2A | 4B | 4A | 4F | 75 | 18 | 2B |
| 0199 | 4D | 4F | 18 | 0A | 54 | 79 | 5C | 13 | 2A | 3E | E9 | 22 | 3B | C5 | 00 | 00 |
| 01C0 | 1A | 50 | 77 | 7A | 0A | 50 | 2C | 00 | 00 | 48 | 4C | 49 | 48 | 4C | 4A | 4A |
| 01E5 | 48 | 48 | 48 | 48 | 4F | 4F | 4C | 4F | 4F | 02 | 68 | 19 | 7B | 70 | 73 | 71 |
| 01C9 | 18 | 71 | 48 | 68 | D2 | 68 | 00 | 69 | D3 | 1D | 5C | 1B | 20 | 1A | 50 | 1C |
| 01D9 | 5C | 1A | 50 | 67 | 30 | CE | 6A | 5C | 3A | DC | 12 | 20 | 10 | 23 | 3E | E9 |
| 0200 | 1D | 50 | 77 | 6D | 30 | 3B | EB | 62 | 48 | 40 | 1C | 7E | 10 | 29 | F2 | 13 |
| 0225 | 62 | C3 | DD | 29 | 3A | FF | 30 | 35 | EC | 61 | E3 | D6 | 29 | E1 | 8B | E1 |
| 0209 | 30 | 37 | FF | 61 | C9 | 36 | FF | 2A | E1 | A5 | E1 | 31 | E4 | 1C | 5C | 42 |
| 0219 | 7F | D5 | 30 | 33 | FF | 45 | 7F | E1 | 31 | ED | 40 | 19 | 0A | 54 | F8 | 2F |
| 0240 | 61 | 30 | 35 | FF | 61 | 30 | 35 | E6 | 61 | 30 | 34 | E6 | 61 | F5 | E1 | 28 |
| 0265 | 31 | F5 | 3A | FF | 62 | F4 | EC | 29 | CE | E3 | A5 | C6 | 30 | 3C | E5 | 61 |
| 0249 | 31 | ED | 61 | 31 | C7 | 61 | 31 | FF | 61 | 30 | 33 | FF | 61 | 30 | 35 | C6 |
| 0259 | 29 | C6 | 8B | C6 | 30 | 36 | F4 | 19 | 0A | 1C | 09 | 19 | 40 | 54 | F0 | 2F |
| 02B0 | 17 | 09 | 17 | 06 | 46 | 7D | 6A | 58 | 46 | 7D | 6A | 5C | 25 | 2F | 05 | 7C |
| 02A5 | 0A | 5A | 00 | 7D | 2F | 1C | 2E | 2F | 00 | 48 | F6 | 40 | 48 | 06 | DB | 40 |
| 0289 | 05 | 79 | 1C | 09 | 50 | 79 | 7A | 79 | 54 | 79 | 7A | 79 | 02 | 5C | 54 | CB |
| 0299 | 2F | 79 | 45 | 7C | 58 | 40 | 7C | 54 | 79 | 6F | D3 | 2F | 05 | 50 | 15 | C1 |
| 02C0 | 11 | 70 | 34 | 00 | 34 | A3 | 1B | 09 | 50 | 10 | 71 | 6D | 70 | 12 | 70 | 71 |
| 02E5 | 1A | 00 | 70 | 2F | 34 | B2 | 34 | A3 | 11 | 71 | 1F | CF | 77 | 74 | 2D | 5C |
| 02C9 | 50 | 30 | 4B | E5 | 2F | 30 | 47 | E2 | 2F | 50 | E3 | 1B | 09 | 1F | 09 | 50 |
| 02D9 | 6D | 63 | 6B | 2F | 17 | 46 | 7E | 00 | 7A | B2 | 40 | 4C | 0A | 5C | 2F | 00 |
| 0300 | 1B | 23 | 3B | C5 | BE | 1F | 5C | 29 | 4D | 4F | 18 | 0A | 5C | 1F | 28 | 4C |
| 0325 | 4F | 19 | 0A | 5C | 1C | 74 | 7A | 74 | B6 | BE | 74 | 7A | 74 | 09 | 54 | D0 |
| 0309 | 2F | 1A | 50 | 68 | 3A | D0 | 63 | C0 | 61 | CA | 62 | D9 | 61 | E9 | 4A | 75 |
| 0319 | 4F | F8 | 42 | 75 | 4E | F8 | 40 | 75 | 4B | F8 | 4F | 75 | 4F | 38 | C7 | 00 |
| 0340 | 05 | C7 | 4F | 79 | 73 | 13 | 70 | 72 | 16 | 70 | 14 | 71 | 79 | 19 | 71 | 18 |
| 0356 | 71 | 2F | 79 | 06 | C7 | 14 | 70 | 73 | 13 | 70 | E7 | 17 | 70 | 19 | 70 | 18 |
| 0349 | 70 | 14 | 28 | C9 | 17 | 71 | 14 | 29 | E4 | 18 | 71 | 14 | 2A | E6 | 19 | 71 |
| 0359 | 15 | 50 | 77 | 7B | 13 | 71 | 70 | 71 | 16 | 71 | 02 | D0 | EF | 00 | 00 | 00 |
| 0380 | 13 | 29 | F3 | 42 | 5F | 27 | 92 | 33 | FF | 10 | 2A | 3B | C5 | 3A | FF | 12 |
| 03A5 | 2A | FA | 22 | 2B | D7 | 30 | 32 | C4 | 20 | BB | D7 | 10 | 28 | F6 | 20 | D7 |
| 0389 | 24 | D7 | 15 | 78 | 01 | C9 | D7 | 71 | 10 | 29 | DC | D7 | BF | BE | 1F | 5C |
| 0399 | 28 | D5 | 20 | 4C | C5 | 24 | 4F | 19 | 0A | 5C | 1F | 50 | A3 | F3 | 00 | 00 |
| 03C0 | 10 | 40 | 5D | 40 | 5F | 40 | 5D | 40 | 57 | DF | 78 | 77 | 11 | 08 | 5C | 10 |
| 03C5 | 20 | 15 | 20 | 18 | 20 | AF | 35 | A3 | 31 | FF | 1B | 28 | ED | 0B | 41 | 5C |
| 03C9 | 3A | FF | 50 | 61 | F6 | 6E | C8 | 5C | 37 | FF | 5C | F6 | 28 | 43 | 41 |
| 03D9 | 75 | 28 | 43 | 40 | 14 | 54 | 79 | 5C | 2F | 16 | 09 | 9A | 17 | 09 | 86 | 2F |
| 0400 | 19 | 0A | 51 | 5C | 30 | 39 | BB | 36 | 85 | 84 | A4 | 11 | 50 | 00 | 00 | 00 |
| 0425 | 00 | 05 | 63 | 06 | 1A | 02 | 45 | 42 | 54 | 02 | 41 | 40 | 54 | 02 | 42 | 44 |
| 0409 | 54 | 02 | 40 | 48 | 5C | 1F | 09 | 50 | 63 | 65 | 6D | 30 | 38 | 9F | 1A | 40 |
| 0419 | 54 | 02 | 43 | 41 | 54 | 42 | 54 | 02 | 40 | 48 | 5C | 1E | 09 | 30 | 3E | FF |
| 0440 | 0C | 1B | 40 | 54 | 02 | 42 | 40 | 5C | 1D | 09 | 8C | 1C | 40 | 54 | 02 | 41 |
| 0465 | 40 | 54 | 42 | 45 | 54 | 02 | 45 | 40 | 5C | 1C | 09 | 8C | 95 | 84 | 30 |
| 0449 | 31 | BF | 11 | 2A | E2 | 30 | 32 | 95 | D1 | 85 | A4 | 19 | 0B | 51 | 54 | 00 |
| 0459 | 50 | 6F | 61 | 00 | 5C | 10 | 0B | 43 | 5F | 27 | 12 | 20 | 23 | 2F | 00 | 00 |
| 0480 | 19 | 0A | 40 | 5D | 5C | 84 | 30 | 31 | BF | 11 | 2A | EB | 85 | CD | 30 | 32 |
| 04A5 | 95 | 80 | 11 | 50 | 00 | 00 | 63 | DD | E3 | 80 | 80 | 95 | 95 | 6B | F6 | E2 |
| 0489 | 1F | 0A | 06 | 46 | 7D | 6A | 58 | 02 | D6 | 36 | B1 | 95 | 1C | 09 | 5C | 84 |
| 0499 | 4A | 1C | 5C | 95 | A9 | 1C | 44 | 54 | 46 | 5C | 30 | 3C | FF | 00 | 00 | 00 |
| 04C0 | 95 | A9 | 1C | 48 | 54 | 4E | 54 | 43 | 5C | 95 | A9 | 1C | 40 | 54 | 41 | 54 |
| 04E5 | 47 | 54 | 42 | 5C | 95 | A9 | A4 | 11 | 4A | 7F | F6 | 1F | 09 | 48 | 7E | 5C |
| 04C9 | 12 | 20 | 30 | 3F | FB | BF | 8E | 1F | 5C | 18 | 0A | 4D | 7F | 4D | 4F | 5C |
| 04D9 | 50 | 1B | 23 | 61 | 27 | 1F | 25 | 64 | 21 | 50 | 13 | 00 | 00 | 30 | 38 | C2 |
| 0500 | 1A | 0A | 50 | 1C | 6A | 38 | C0 | 61 | 30 | 3A | E5 | 61 | 30 | 3A | E3 | 62 |
| 0525 | FD | 61 | 30 | 3A | FF | C7 | 10 | 29 | 3A | FF | F8 | 1C | 4B | 75 | 4D | 5E |

TABLE I-continued

| | | | | | | | | | | | | | | | | |
|---|---|---|---|---|---|---|---|---|---|---|---|---|---|---|---|---|
| 0509 | 46 | B8 | FD | 4A | 5E | 4F | B8 | E2 | FD | 61 | CC | 79 | 11 | 5C | 2F | 1C |
| 0519 | 50 | 61 | EA | C8 | 1D | 0A | 40 | 7F | FD | 54 | CA | C8 | 00 | 30 | 32 | FF |
| 0548 | 4A | 75 | 4E | 5E | 48 | B8 | 38 | C0 | 4C | 5E | 49 | B8 | 30 | 3B | E2 | 47 |
| 0565 | 75 | 4B | 5E | 4C | B8 | DE | 48 | 5E | 4B | B8 | EE | DE | 4D | 75 | 5E | 4F |
| 0549 | B8 | DE | 30 | 3B | C8 | 4E | 5E | 4D | 75 | B8 | EE | DE | 5F | 27 | BF | 94 |
| 0559 | 34 | A1 | 3A | FF | 00 | 00 | 00 | 00 | 00 | 94 | B8 | 34 | A1 | 3E | E9 | |
| 0580 | 13 | 09 | 13 | 0A | 1F | 09 | 2B | C3 | 2A | FA | 40 | 7F | EB | 58 | 00 | 7F |
| 05A5 | EB | 38 | C0 | 2A | F4 | 47 | 4A | 4B | 4D | 11 | 5C | 2F | 47 | 4F | 75 | 4F |
| 0589 | 18 | 27 | 00 | E0 | 79 | 61 | 00 | 75 | 2C | 00 | 00 | 40 | 49 | 4E | 48 | 4D |
| 0599 | 4F | 4A | 48 | 40 | 46 | 4B | 41 | 54 | CB | 39 | C9 | 1C | 09 | CB | 00 | 00 |
| 05C0 | 50 | 77 | 75 | 79 | 61 | C6 | 79 | 05 | 1F | 52 | 66 | 7D | 6A | 5A | 30 | 48 |
| 05E5 | F3 | F7 | 06 | 11 | 4D | 7F | 05 | 2F | BF | 94 | 34 | A1 | 12 | 28 | B8 | C8 |
| 05C9 | E9 | 28 | CC | 1B | 2B | 2E | 2F | 18 | 29 | 2E | 2F | 12 | 3E | E9 | 1A | |
| 05D9 | 00 | 01 | C9 | 70 | 30 | 33 | FF | 00 | 2A | E0 | A3 | A5 | 3A | FF | 3E | CB |
| 0600 | 13 | 2A | 3B | C5 | 18 | 27 | 00 | 00 | 10 | 0A | 53 | 77 | 7C | 5C | 57 | |
| 0625 | 30 | 44 | DC | 02 | C7 | 13 | 0A | 53 | 5F | 58 | F4 | 30 | 39 | BF | 11 | 50 |
| 0609 | 1F | 5C | 30 | 39 | AF | 11 | 50 | 1F | 7F | 38 | C0 | 40 | 13 | 5C | 39 | D6 |
| 0619 | 27 | DE | 06 | 1C | 09 | 40 | 5C | 77 | 7C | 54 | D5 | 2F | 3A | FF | 00 | 00 |
| 0640 | 10 | 00 | 50 | 61 | DE | 6F | 6D | D7 | 64 | 5C | 40 | 91 | FF | 1A | 0A | 50 |
| 0665 | 61 | C3 | 6F | 5C | 30 | 3B | FF | 8F | B9 | BF | 30 | 31 | AE | BF | 94 | BB |
| 0649 | 16 | 40 | 7F | E2 | 17 | 7F | E2 | 35 | A3 | 34 | A1 | 00 | 00 | 3A | FF | 00 |
| 0659 | 19 | 0A | 52 | 56 | E9 | 05 | 1F | 52 | 66 | 7D | 6A | 5A | 30 | 48 | C5 | 2F |
| 0680 | 18 | 28 | FD | 20 | DA | 29 | E7 | DA | 24 | 16 | 28 | DA | 13 | 29 | 31 | DE |
| 06A5 | 3A | FF | 18 | 29 | F4 | 21 | DA | 25 | 20 | 16 | 28 | EE | DA | 3B | C5 | 13 |
| 0689 | 28 | E5 | 08 | 23 | DA | 13 | 0A | 53 | 5F | 58 | C9 | AD | EF | B9 | AD | DA |
| 0699 | 13 | 2B | EA | C2 | 0B | 2A | C2 | F1 | 48 | 13 | 5F | 27 | 26 | 30 | 39 | E3 |
| 06C0 | 0B | 2A | FB | F3 | 1E | 09 | 2A | 44 | 40 | 48 | 05 | 1C | 09 | CD | 79 | 61 |
| 06E5 | 00 | 75 | 2C | 00 | 00 | 4B | 4D | 49 | 48 | 43 | 47 | 4D | 48 | 46 | 44 | 4D |
| 06C9 | 40 | 7F | 06 | 5C | 54 | EB | 02 | 39 | C9 | 79 | 6D | 1C | 09 | 30 | 39 | C9 |
| 06D9 | 13 | 2B | EA | C2 | 0B | 2A | 3B | C5 | 48 | 13 | 5F | 27 | 22 | 30 | 39 | F1 |
| 0700 | 13 | 28 | CF | 41 | 5F | 27 | CC | 12 | 28 | D9 | 20 | 05 | 1F | 0A | 4F | 58 |
| 0725 | 7D | 6A | 75 | 4F | 5C | 61 | FA | 6F | 7C | 6E | CB | 62 | 00 | 74 | 1A | 0A |
| 0709 | 50 | 61 | D2 | 6E | 38 | C8 | 54 | F6 | 16 | 74 | 54 | 79 | 5C | CC | A1 | BF |
| 0719 | 94 | BB | 34 | A1 | 06 | 17 | 46 | 7D | 6A | 0A | 5A | 40 | 7C | 0A | 3D | F2 |
| 0740 | A5 | 3A | FF | 1C | 50 | 75 | 12 | 28 | F9 | FA | 24 | 26 | 27 | 1A | 0A | 4F |
| 0765 | 54 | F5 | 10 | 00 | 4F | 5C | 10 | 27 | 79 | 75 | 10 | 00 | 43 | 7F | F6 | DF |
| 0749 | 79 | 91 | 1D | 0A | 50 | 12 | 61 | E2 | 23 | 2B | 41 | 40 | 10 | 0B | 7E | 5C |
| 0759 | 41 | 13 | 30 | 3A | E4 | 06 | 1F | 52 | 77 | 7D | 6A | 5A | 30 | 48 | C5 | 2F |
| 0780 | 11 | 00 | 2A | 48 | 45 | 1E | 58 | 48 | 5C | 1B | 20 | 2F | 40 | 32 | B6 | 3D |
| 07A5 | A9 | 1C | 09 | 50 | 74 | 7A | 74 | 32 | 86 | 3D | A9 | 74 | 7A | 74 | 5C | 55 |
| 0789 | C3 | 2F | 77 | 75 | 79 | 61 | 2F | 79 | 05 | 1C | 51 | 7C | 55 | D1 | CB | 13 |
| 0799 | 0B | 2B | 2E | 10 | 2A | 2E | 13 | 28 | 2E | 2F | 51 | 59 | 00 | 51 | 5D | 2F |
| 07CB | 3D | E0 | 33 | E1 | 30 | 3F | FF | 30 | 36 | FF | 30 | 3D | FF | 30 | 36 | FF |
| 07E5 | 30 | F2 | 35 | F0 | 35 | EF | 35 | FF | 34 | EA | 32 | FF | 32 | C6 | 33 | E1 |
| 07C9 | 3D | E9 | 35 | EC | CC | D4 | 17 | C0 | 36 | EB | 3A | D3 | 30 | 37 | E9 | 30 |
| 07D9 | 38 | FF | ED | 33 | FB | 37 | C0 | 30 | 36 | D5 | 30 | 36 | E6 | 35 | EB | 00 |

TABLE II

| | | | | | | | | | | | | | | | | |
|---|---|---|---|---|---|---|---|---|---|---|---|---|---|---|---|---|
| 0000 | 44 | 0E | 40 | 0C | D1 | 0F | 61 | 80 | B7 | 29 | 48 | 58 | 4E | 79 | 06 | DE |
| 0010 | 79 | 06 | 47 | 40 | 79 | 06 | D5 | 41 | 79 | CC | 04 | 1F | BB | 04 | A3 | 22 |
| 0020 | 4F | 79 | 18 | 7B | 06 | F6 | 04 | C7 | 04 | CC | 40 | 04 | A4 | 06 | 8E | 79 |
| 0030 | 18 | 7B | 04 | 1F | 71 | 1F | 90 | 04 | 1F | 2A | 2D | 30 | 04 | 12 | 96 | 2D |
| 0040 | 34 | C8 | 28 | 52 | 5A | BC | 06 | 7C | 04 | 36 | 37 | 06 | 7B | 4F | 58 | BC | 2D |
| 0050 | 36 | 06 | CE | D1 | 18 | 83 | 06 | CE | 1A | 11 | 25 | 50 | 65 | 83 | 06 | CE |
| 0060 | 50 | 61 | 8B | 2D | 37 | 04 | 1F | 61 | F5 | 81 | 10 | 6F | 04 | 10 | B6 | 04 |
| 0070 | 16 | D7 | 07 | 84 | 7F | 81 | 10 | A9 | 18 | 1D | 10 | A9 | 06 | DC | 4D | 79 |
| 0080 | 27 | 4C | 79 | 7A | 4F | 04 | CE | 6F | BB | 04 | CE | 6F | BB | 04 | CF | 7A |
| 0090 | 2D | 33 | 26 | 32 | 2B | D1 | 04 | 14 | C2 | 4F | 4E | 4D | 07 | 46 | 79 | 54 |
| 00A0 | 58 | BF | 7F | 80 | 81 | 3D | 33 | 54 | 58 | BF | 7F | 80 | 81 | 3D | 32 | 54 |
| 00B0 | 58 | 81 | 10 | 12 | 7F | 80 | 81 | 3D | 31 | 54 | 58 | BF | 7F | 80 | 81 | 3D |
| 00C0 | 30 | 78 | 10 | 60 | 06 | 46 | 50 | 01 | 81 | 83 | 85 | 04 | 14 | D7 | 04 | 12 |
| 00D0 | A2 | 04 | 12 | AD | 06 | DC | 50 | 73 | 86 | 27 | 4E | 72 | 79 | 06 | DC | 4E |
| 00E0 | 79 | 7A | 27 | 50 | 29 | 0C | 07 | DC | 50 | 08 | 76 | 79 | 7A | 25 | 50 | 6B |
| 00F0 | 03 | AA | 80 | 4F | 79 | 04 | 16 | DA | 25 | 50 | 65 | 4A | 79 | 43 | 08 | 06 |
| 0100 | 8D | 10 | 4B | 46 | 49 | 06 | 5C | 08 | 3A | 50 | 60 | 0F | 09 | 0F | 70 | 50 |
| 0110 | 5C | 80 | 83 | 0F | 09 | 0F | B1 | 38 | 7B | 7A | 06 | AC | 53 | 5F | BC | 06 |
| 0120 | 9C | 50 | 61 | 81 | 79 | 7A | 5C | B8 | 7A | F1 | 06 | C5 | 40 | 73 | 89 | 41 |
| 0130 | 73 | 80 | 84 | 50 | 5C | 42 | 73 | 80 | F7 | 06 | C7 | 45 | 73 | 80 | B8 | 50 |
| 0140 | 5C | 49 | 73 | 80 | B2 | 50 | 5C | 02 | 44 | B0 | 06 | DB | 4F | 80 | 51 | 59 |
| 0150 | 02 | BB | BA | CA | 06 | C4 | 4F | 79 | 06 | F0 | D1 | 1A | 82 | 06 | 68 | 7E |
| 0160 | 82 | 1A | D3 | 81 | 1A | C3 | 1A | C9 | 06 | 68 | 50 | 6D | 85 | 1A | C9 | 1A |
| 0170 | C9 | 1A | B9 | 1A | B9 | 65 | 81 | 1A | B1 | 06 | 9C | D1 | 1A | B9 | 06 | 9C |
| 0180 | 79 | 06 | FC | 45 | 79 | 1A | B9 | 1A | A8 | 06 | FC | 4B | 1A | 5C | 49 | 1A |
| 0190 | B9 | 1A | A8 | 06 | FC | 47 | 5C | 41 | 5C | 4C | 79 | 1A | B9 | 1A | A8 | 06 |
| 01A0 | FC | 4F | 5C | 4E | 5C | 48 | 5C | 5C | 4C | 79 | 1A | B9 | 1A | A8 | 1A | 7A |
| 01B0 | 06 | F0 | D1 | 06 | 9C | 50 | 3C | 5C | BB | 1A | 7A | 06 | 9C | 50 | 3C | 54 |
| 01C0 | 5C | BA | 06 | CA | 4F | 58 | 02 | CC | BA | 1A | 9A | 06 | F5 | 38 | 4D | 4A |
| 01D0 | 5C | 38 | 4F | 4E | 5C | 38 | 4B | 4D | 5C | 38 | 47 | 4F | 79 | 06 | FF | 1A |
| 01E0 | 94 | 06 | F5 | 4F | 5C | 38 | 4E | 4C | 5C | 4D | 5C | 38 | 47 | 4F | 79 | 06 |
| 01F0 | FE | 1A | 94 | 06 | F6 | 4F | 5C | 38 | 35 | 06 | FD | 1A | 94 | 06 | F7 | 4F |

TABLE II-continued

| | | | | | | | | | | | | | | | | |
|---|---|---|---|---|---|---|---|---|---|---|---|---|---|---|---|---|
| 0200 | 5C | 38 | 4F | 4E | 5C | 38 | 4A | 4D | 5C | 38 | 4F | 4A | 79 | 06 | FC | 1A |
| 0210 | 94 | 1A | B9 | 06 | F0 | D1 | 1A | 82 | 06 | 68 | 7E | 82 | 1A | C3 | 81 | 1A |
| 0220 | D3 | 06 | 9A | 4C | 08 | 04 | 15 | 25 | BB | BA | F6 | 7A | 06 | FA | 3B | 53 |
| 0230 | 6A | 71 | 66 | 5B | B9 | 7A | 06 | CA | 53 | 5B | BC | AF | 06 | FA | 3A | 53 |
| 0240 | 60 | 71 | 66 | 5B | B9 | 7A | 4F | 06 | C0 | 5C | 02 | 44 | BB | 7A | 06 | CA |
| 0250 | 4E | 72 | 79 | 6A | 7A | 58 | B8 | 60 | 08 | 78 | 80 | 7A | 3B | 06 | 9C | 3C |
| 0260 | 50 | 70 | 5C | BA | B3 | 06 | 68 | 3B | 4C | 70 | 7A | 50 | 60 | 08 | 78 | 80 |
| 0270 | B3 | 06 | FA | 3B | 53 | 6A | 71 | 66 | 5B | 02 | CC | B7 | B0 | 06 | F8 | 47 |
| 0280 | 79 | 06 | F6 | 30 | 7A | 3A | 06 | 9C | 4F | 54 | 60 | 70 | 5C | B9 | 7A | 3A |
| 0290 | 80 | 3B | 06 | 8E | 7D | 7A | 06 | 68 | 4C | 73 | 45 | 42 | 7F | 80 | 48 | 38 |
| 02A0 | 81 | 60 | 6E | 06 | FC | 79 | 7C | 40 | 4F | 34 | 06 | FD | 79 | 5C | BC | 4E |
| 02B0 | 12 | A8 | 06 | CE | 50 | 5C | 60 | 08 | 50 | 01 | 06 | CD | 06 | A7 | 06 | 7D |
| 02C0 | 06 | 57 | 06 | 2D | 06 | 07 | 0F | 07 | CC | 79 | 0D | 06 | DC | 79 | 78 | 80 |
| 02D0 | 7A | 06 | DC | 50 | 73 | B6 | 4E | 55 | 4E | 72 | B1 | 2E | 7F | 80 | 7A | 07 |
| 02E0 | 42 | 50 | 6F | 83 | 7C | 85 | 30 | 4F | 06 | 42 | 79 | B1 | 32 | AF | 3A | 49 |
| 02F0 | 71 | 66 | 5C | BA | 10 | 2B | 40 | 73 | 79 | 7A | 00 | 00 | 00 | 00 | 00 | 06 |
| 0300 | 06 | 47 | 50 | 01 | 4F | 4F | 49 | 4B | 45 | 4B | 45 | 4F | 4D | 4F | 4F | 06 |
| 0310 | 49 | 74 | 79 | 06 | 8F | 7F | 1B | 51 | 06 | 50 | 4F | 77 | 82 | 06 | 51 | 77 |
| 0320 | 13 | BF | 1B | 68 | 40 | 0F | 61 | 13 | 73 | 69 | 13 | A6 | 01 | 45 | 48 | 46 |
| 0330 | 44 | 43 | 42 | 07 | 52 | 79 | 0D | 60 | 07 | 51 | 79 | 0F | 60 | 06 | 50 | 79 |
| 0340 | 06 | 51 | 40 | 72 | 79 | 03 | FF | 4F | 06 | 50 | 72 | 79 | 06 | 52 | 50 | 3A |
| 0350 | 06 | 9C | 70 | 5C | 81 | 13 | 8E | 40 | B8 | 66 | 00 | 60 | 07 | 9F | 79 | 0D |
| 0360 | 60 | 07 | 9E | 79 | 1B | 68 | 0F | 60 | 07 | 9D | 79 | 0D | 60 | 07 | 9C | 79 |
| 0370 | DA | 06 | 49 | 50 | 03 | FE | 80 | 4F | 79 | 06 | 68 | 50 | 60 | 07 | 49 | 75 |
| 0380 | 61 | 7A | 4F | 7D | 4E | 7F | 80 | 4D | 1B | 46 | 13 | DD | 0D | 06 | 52 | 79 |
| 0390 | 61 | 13 | E9 | 1B | 68 | 13 | C9 | 06 | 55 | 3A | 4F | 70 | 58 | 60 | 08 | 4F |
| 03A0 | 70 | 58 | 60 | 09 | 7F | 83 | 04 | E4 | FF | 7A | 04 | E5 | FF | 7A | 37 | 06 |
| 03B0 | 51 | 4F | 79 | 06 | 50 | 79 | 06 | 53 | 79 | 08 | 06 | 47 | 14 | 80 | 04 | E3 |
| 03C0 | FF | 0D | 07 | 55 | 79 | 0F | 06 | 54 | 58 | 46 | 07 | 47 | 73 | 80 | 33 | 03 |
| 03D0 | BB | 80 | 33 | 7A | 00 | 13 | 42 | 73 | EC | 08 | 5D | 8B | 90 | FF | 98 | AF |
| 03E0 | 50 | 62 | 7A | 7B | 00 | 29 | 4F | A3 | DE | 33 | 63 | 8B | 94 | FF | 9C | CE |
| 03F0 | 00 | 00 | 00 | 00 | 00 | 38 | 53 | C9 | EC | 55 | 63 | 8B | 94 | FF | AA | FF |
| 0400 | DA | A0 | 22 | 41 | 22 | 41 | 22 | 41 | 22 | 42 | D9 | 14 | 21 | 42 | 22 | 41 |
| 0410 | 22 | 41 | 24 | 41 | 22 | 41 | 22 | 41 | 2E | 41 | 22 | D6 | BC | 27 | D6 | 88 |
| 0420 | F4 | 13 | D6 | 20 | 27 | D4 | B4 | 43 | D4 | 74 | 47 | D4 | 14 | 47 | D3 | C4 |
| 0430 | 45 | 8F | 9B | 1A | 31 | 12 | 31 | 12 | BF | 56 | FC | 06 | BF | 05 | F3 | 13 |
| 0440 | 31 | 8E | BA | BE | 66 | BC | 6E | BC | 62 | BC | 59 | 11 | 8C | 26 | FC | 02 |
| 0450 | 73 | 9E | F2 | 13 | FF | DD | 70 | 41 | 24 | 43 | 2F | D3 | B8 | D3 | 94 | 27 |
| 0460 | D3 | 58 | 27 | 90 | 06 | F3 | 15 | 73 | 70 | 01 | FF | 96 | 1C | F3 | 6E | 79 |
| 0470 | 3C | F4 | 3A | FF | 9B | 60 | F5 | EF | F5 | EF | F5 | EF | F5 | 03 | FF | 50 |
| 0480 | 03 | 44 | 4F | 47 | 07 | 9B | 79 | 50 | 13 | 41 | 21 | 7D | 82 | 7C | 80 | 7A |
| 0490 | 04 | 14 | 66 | 2B | 50 | 3F | 54 | 7B | 5C | B9 | 7A | FF | 91 | AA | 36 | 91 |
| 04A0 | 4A | 3A | 75 | 7E | F2 | 26 | 73 | B8 | 0B | FF | DA | 94 | DA | 84 | DA | 74 |
| 04B0 | D9 | F0 | 41 | D9 | 04 | D8 | F4 | D8 | B4 | D8 | A4 | D8 | 74 | D8 | 64 | D8 |
| 04C0 | 54 | D4 | 58 | F8 | 13 | D3 | 38 | 23 | D2 | D4 | F4 | 13 | 92 | 79 | 19 | 90 |
| 04D0 | 1B | 12 | 31 | 12 | 8F | 5F | 12 | 31 | 12 | 31 | 12 | 31 | 8E | C9 | 31 | 12 |
| 04E0 | 31 | 12 | 31 | 12 | 31 | 12 | BE | 7B | 12 | 31 | 12 | 31 | 11 | BC | 6B | 12 |
| 04F0 | 31 | 12 | 8C | 23 | 12 | 31 | 12 | 75 | CE | F2 | 26 | 74 | 3E | 23 | FF | 00 |
| 0500 | BE | 59 | F5 | 13 | FA | 02 | F5 | 0A | 8D | A0 | F5 | 09 | 8A | 30 | 8A | 08 |
| 0510 | F5 | 08 | FF | DF | 98 | 41 | DF | 34 | F8 | 14 | DA | 50 | D9 | F8 | D4 | B0 |
| 0520 | 4A | 92 | 5B | F3 | 16 | 8C | 0B | F3 | 10 | 83 | 4B | 83 | 2D | 82 | 83 | FA |
| 0530 | 01 | 82 | 65 | 81 | E3 | FF | DF | AC | 23 | DF | 88 | 41 | DF | 70 | 44 | DF |
| 0540 | 38 | F8 | 14 | DD | A8 | DC | 30 | 27 | DC | 00 | 46 | DB | AC | 2E | D6 | 00 |
| 0550 | 41 | 27 | 41 | D5 | C0 | 46 | D2 | 80 | 46 | D0 | E0 | 23 | 92 | 13 | 16 | 3D |
| 0560 | 91 | 50 | 91 | 02 | 11 | 31 | 12 | 31 | 12 | 90 | DE | 90 | DB | F3 | 16 | 8F |
| 0570 | BE | 8F | B9 | 8F | B4 | 8D | 34 | 8C | C8 | 13 | 8C | B3 | 13 | 8A | 28 | 34 |
| 0580 | 86 | 8E | 83 | 82 | 81 | 1B | 81 | 11 | 81 | 07 | 80 | FD | 76 | BC | 49 | 76 |
| 0590 | 58 | 02 | 23 | 76 | 36 | 21 | 0A | 23 | 75 | D2 | 01 | 75 | 2C | 49 | 73 | 6C |
| 05A0 | F2 | 48 | 22 | 0F | 72 | A0 | F2 | 48 | 71 | 44 | 07 | FF | D5 | 6C | F4 | 2D |
| 05B0 | 91 | 7A | 11 | 31 | 12 | 31 | 12 | 31 | 11 | 8B | D5 | F3 | 8A | 76 | 1C | 23 |
| 05C0 | 04 | 24 | 75 | EE | 05 | 23 | FF | DD | C4 | 24 | DB | B8 | 41 | D5 | 78 | 41 |
| 05D0 | D3 | B0 | 43 | D2 | 84 | 46 | 92 | 9D | 1A | 91 | AE | 8F | 38 | 11 | 31 | 12 |
| 05E0 | 31 | 12 | 31 | 12 | 31 | 11 | 8D | 6E | 21 | 13 | 88 | E6 | 75 | F6 | 03 | 73 |
| 05F0 | 76 | 01 | 72 | B0 | 07 | 71 | E6 | 01 | 71 | 20 | 07 | FF | 00 | 00 | 00 | 00 |
| 0600 | 11 | AB | D7 | 03 | 22 | 7A | 7B | 06 | EB | 4F | 79 | 22 | 79 | 7A | 06 | CA |
| 0610 | 58 | 02 | BB | BB | 4F | 06 | EA | 58 | 02 | BB | BB | 7A | 47 | 4B | 06 | BF |
| 0620 | 04 | C5 | 61 | 7B | 7A | 06 | C5 | 12 | 09 | CC | 06 | C5 | 40 | 5C | 41 | 5C |
| 0630 | 44 | 5C | 44 | 5C | 48 | 5C | 44 | 5C | F1 | 2F | 33 | 06 | E9 | 30 | 17 | 86 |
| 0640 | D7 | 62 | 23 | 25 | 4F | 77 | 7B | 58 | 13 | 1F | 04 | 17 | 0F | 06 | EA | 7F |
| 0650 | 82 | 54 | 58 | BA | 4B | 0D | 60 | 67 | 7A | 72 | 67 | 6E | 7A | 8F | 22 | 7C |
| 0660 | AB | 06 | EB | 50 | 01 | 8E | 7A | 4A | 4A | 49 | 48 | 47 | 0C | 33 | 06 | E7 |
| 0670 | 7F | 82 | 4F | F2 | B8 | 06 | C5 | 4E | 73 | 80 | 79 | 06 | C5 | 50 | 61 | 8D |
| 0680 | 61 | 9D | 64 | 6E | 7A | 42 | 08 | 7C | 83 | 1E | 38 | 92 | 7A | 8B | 44 | 08 |
| 0690 | 1E | 36 | 82 | 7A | 06 | 63 | 06 | 05 | 06 | 47 | 06 | 21 | 1E | 32 | 92 | 9F |
| 06A0 | 48 | 08 | 1E | 34 | B2 | 07 | 8E | 7C | 7A | 45 | 07 | 9B | 79 | 08 | 1E | 3A |
| 06B0 | A2 | 7A | 03 | 00 | 7A | 02 | 00 | 7A | 06 | CA | 77 | 7A | 58 | 02 | 88 | B9 |
| 06C0 | 09 | 06 | 68 | 79 | 7B | 06 | 81 | 06 | 12 | 06 | 03 | 06 | 44 | 3A | 0F | 07 |
| 06D0 | C7 | 70 | 0D | 07 | C6 | 71 | 7B | 7A | 06 | 7C | 35 | 2D | 35 | CC | EE | 06 |
| 06E0 | CE | 1A | 11 | 06 | CE | 50 | 61 | 40 | 4F | 25 | 72 | 01 | 89 | 17 | D1 | 17 |
| 06F0 | C4 | 17 | BB | 17 | B2 | 17 | AC | 29 | 7F | 17 | D5 | 06 | E0 | 06 | E1 | 06 |
| 0700 | E2 | 06 | E3 | 06 | E4 | 33 | 1A | 4D | 29 | 00 | 07 | CC | 50 | 0C | 07 | DC |
| 0710 | 50 | 75 | 61 | 4F | 42 | 08 | 26 | 7F | 8A | 06 | CE | 50 | 03 | 00 | 80 | 45 |

TABLE II-continued

| | | | | | | | | | | | | | | | | |
|---|---|---|---|---|---|---|---|---|---|---|---|---|---|---|---|---|
| 0720 | 60 | 0C | 09 | 79 | 61 | 04 | 12 | 96 | 16 | 20 | CC | EE | 1F | 8F | 2D | 7D |
| 0730 | 17 | 9C | 29 | 7E | 81 | 16 | 02 | CC | EE | 1F | 8E | 29 | 7D | 81 | 16 | 00 |
| 0740 | CC | EE | 1F | 8D | 29 | 7C | 81 | 17 | FE | CC | EE | 1F | 8C | 06 | 7C | 7C |
| 0750 | 81 | 17 | FC | CC | EE | 06 | 7C | 7D | 84 | 31 | 1F | 90 | 16 | 08 | 2D | 31 |
| 0760 | 29 | 37 | B6 | 1F | 90 | 04 | 1F | 70 | 26 | 30 | 04 | 1F | 2A | 17 | DA | 4F |
| 0770 | 4E | 4D | 4C | 4B | 25 | 58 | 4E | 79 | 7A | 2D | 32 | 04 | 13 | 09 | 00 | 00 |
| 0780 | 09 | 0F | 09 | 50 | 09 | 0F | 09 | 7A | 11 | 4F | 17 | 24 | 06 | E0 | 06 | E5 |
| 0790 | 4F | 56 | 40 | 5E | 02 | 44 | B8 | 7A | 06 | 6B | 49 | 08 | C0 | 5C | BC | 7A |
| 07A0 | 4E | 4F | 5C | BC | 7A | 06 | DF | 20 | 50 | 7A | 28 | 06 | AF | 7F | 48 | 46 |
| 07B0 | 7E | 6C | 07 | 68 | 79 | 4B | 0D | 7F | 7C | 7A | 45 | 06 | 68 | 79 | 7A | 00 |
| 07C0 | 28 | 53 | 5B | BC | 7A | 2E | 8E | 06 | 95 | 53 | 57 | 5C | BB | 7A | 24 | 7E |
| 07D0 | 43 | 40 | 06 | C0 | 79 | 7A | 4F | 58 | 4F | 79 | 7A | 04 | 13 | 0E | 00 | 00 |
| 07E0 | FD | F8 | F1 | FF | E3 | E2 | DA | D6 | BF | B5 | 21 | 32 | 04 | 14 | 09 | 00 |
| 07F0 | CB | 4E | 4D | EF | 4B | CF | 4C | CC | 9F | 7D | 4A | EE | 4F | 7F | 43 | 44 |
| 0800 | 04 | 79 | 10 | 70 | F9 | 27 | 4A | 79 | 0C | 4F | 02 | FC | 83 | 27 | 51 | 0C |
| 0810 | 51 | 1D | 48 | 07 | 67 | 50 | 06 | BF | 04 | C7 | 27 | 52 | 0C | 3B | 47 | 71 |
| 0820 | 50 | 09 | 52 | 50 | 04 | C7 | 04 | FD | FF | 04 | 3C | 04 | C6 | 21 | 7F | 8B |
| 0830 | 27 | 50 | 0C | 02 | FF | 80 | 89 | 27 | 4E | 72 | 10 | F8 | 04 | CA | 04 | CC |
| 0840 | AE | 4F | 00 | 6F | BC | 04 | CA | 04 | CC | 04 | A2 | 4E | 04 | A7 | 03 | 00 |
| 0850 | B9 | 2A | 7C | 95 | 06 | DE | 40 | 04 | A5 | 68 | 83 | 47 | 79 | 10 | 80 | 79 |
| 0860 | 37 | 2A | 30 | D5 | 40 | 04 | A3 | 6F | 60 | 58 | 04 | 1C | 75 | 06 | DE | 50 |
| 0870 | 01 | 13 | D0 | 13 | BF | 00 | 12 | 05 | 14 | A1 | 00 | 15 | E6 | 15 | 98 | 13 |
| 0880 | 09 | 04 | 79 | 8A | F5 | 80 | 81 | 26 | 7F | 10 | FF | 11 | A0 | 10 | B6 | 4F |
| 0890 | 4E | 06 | 40 | 79 | 04 | 58 | 04 | 1A | 24 | F9 | 40 | 04 | A7 | 03 | FF | 04 |
| 08A0 | A2 | 2C | 37 | 06 | DB | 3A | 4F | 71 | 82 | 07 | 4F | 35 | 03 | C0 | 82 | 07 |
| 08B0 | 4F | 33 | 58 | 49 | 71 | 66 | 58 | 45 | 71 | 6A | 00 | 58 | 02 | BB | B3 | 06 |
| 08C0 | D5 | 50 | 03 | F8 | 82 | 41 | 79 | 89 | 5C | 61 | 86 | 50 | 63 | 83 | 4E | 58 |
| 08D0 | 4F | 54 | 2C | 7D | 88 | 31 | 7E | 82 | 07 | 4C | 31 | 4B | 76 | 79 | 06 | 40 |
| 08E0 | 50 | 61 | 81 | 17 | B5 | F5 | 04 | 10 | 9C | 2D | 7F | 82 | 04 | 10 | E5 | 24 |
| 08F0 | 7F | 11 | 6B | 22 | 7D | 11 | 67 | F4 | 11 | A0 | 1F | 65 | E5 | 2D | 7E | 11 |
| 0900 | D8 | 32 | 15 | 1B | DB | E7 | C8 | E7 | 06 | A0 | 50 | 69 | 85 | 06 | A1 | 50 |
| 0910 | 69 | 80 | 91 | 20 | 50 | 63 | 81 | 11 | DA | 3A | 06 | A0 | 49 | 71 | 66 | 5C |
| 0920 | 02 | DD | B8 | 24 | 30 | 1F | 65 | 2F | 7F | 86 | 7C | 11 | 67 | 26 | 7F | 80 |
| 0930 | CC | 1A | 51 | 22 | 7D | 98 | 26 | 7F | 95 | 2F | 7F | 92 | 7C | 90 | 30 | 06 |
| 0940 | E7 | 33 | 2F | 7D | 49 | 4A | 06 | CA | 08 | C0 | 58 | 02 | BB | BA | F6 | 11 |
| 0950 | 67 | 35 | 30 | 1D | 2F | 4D | 08 | 04 | 1C | 6C | E7 | 2D | 32 | 11 | 70 | 06 |
| 0960 | A3 | 7F | 82 | 2D | 36 | 8A | 2D | 7E | 80 | 86 | 2E | 33 | 7E | 80 | 8C | 2D |
| 0970 | 36 | 2E | 32 | 21 | 7D | 11 | AE | 06 | 48 | 34 | F0 | 81 | 11 | D8 | 2A | 7D |
| 0980 | 11 | CE | 2A | 7E | 80 | 83 | 2C | 7F | 80 | 8D | 26 | 32 | E0 | 1F | 2A | 2F |
| 0990 | 34 | 2C | 30 | 83 | 24 | 37 | F0 | B1 | 24 | 7E | 80 | 82 | 26 | 7D | 83 | 2C |
| 09A0 | 7C | 9A | 86 | 35 | 22 | 7D | 11 | 1D | 21 | 7D | 11 | 1D | 31 | 2D | 36 | 1D |
| 09B0 | 2F | 4D | 08 | 04 | 1C | 6C | 2B | D0 | 26 | 36 | 1F | 60 | E7 | DA | 04 | 1A |
| 09C0 | 70 | 28 | 4B | 08 | 3F | 7F | 4D | 4F | 04 | C7 | 04 | CC | 07 | 67 | 79 | 50 |
| 09D0 | 0A | 58 | 02 | 44 | B9 | 04 | 1A | 6E | 21 | 7D | 85 | 7C | 80 | 83 | 34 | E7 |
| 09E0 | 80 | E7 | 2C | 34 | 24 | 7C | 81 | 12 | D5 | 34 | 4F | 04 | AF | 06 | A1 | 41 |
| 09F0 | 09 | 50 | 3D | 58 | 00 | 78 | B9 | 06 | 41 | 4E | 79 | 06 | 8D | 41 | 09 | 17 |
| 0A00 | A4 | 07 | AB | 50 | 60 | 06 | 85 | 58 | 07 | A4 | 50 | 60 | 58 | 07 | A3 | 50 |
| 0A10 | 60 | 58 | 07 | A2 | 50 | 60 | 58 | 06 | AF | 43 | 09 | 50 | 3D | 58 | 78 | BA |
| 0A20 | 06 | 41 | 4D | 79 | 06 | 81 | 43 | 09 | 17 | A4 | 26 | 7E | 80 | 81 | D7 | 01 |
| 0A30 | 12 | 55 | 85 | 12 | 87 | 12 | 77 | 12 | 63 | 04 | 16 | 27 | 06 | 85 | 7F | 47 |
| 0A40 | 4F | 06 | 9B | 79 | 06 | 84 | 51 | 59 | BC | 1F | 23 | 41 | 09 | 06 | 8E | 04 |
| 0A50 | 10 | 64 | 1F | 1D | 1F | 23 | 43 | 09 | 06 | 82 | 04 | 10 | 65 | 1F | 12 | DA |
| 0A60 | 2D | 7C | 04 | 10 | C0 | 26 | 7C | 8A | 9C | 21 | 36 | D7 | 63 | 16 | D8 | 06 |
| 0A70 | 94 | 4F | 79 | C8 | E0 | 1A | 51 | 8B | 24 | 7F | 80 | 89 | 26 | 7C | A9 | F3 |
| 0A80 | 21 | 7D | 82 | E0 | 2C | 30 | 12 | 55 | 04 | 1B | FF | 21 | 7E | 00 | 00 | C8 |
| 0A90 | 1A | 51 | 06 | EA | 37 | 50 | 58 | BB | 06 | E7 | 33 | 8D | 04 | 19 | E5 | 04 |
| 0AA0 | 19 | FB | A7 | 06 | 9C | 46 | 04 | 1F | 64 | A0 | 26 | 36 | 13 | 07 | 29 | 7F |
| 0AB0 | 4F | 47 | 07 | E0 | 79 | 7E | 4F | 47 | 07 | E1 | 79 | 7D | 4F | 47 | 07 | E2 |
| 0AC0 | 79 | 7C | 4F | 47 | 07 | E3 | 79 | 06 | 7C | 7C | 4F | 47 | 07 | E4 | 79 | EE |
| 0AD0 | 2B | 50 | 07 | C2 | 5C | 40 | 73 | 80 | 50 | 07 | C1 | 79 | 06 | A4 | 7F | 42 |
| 0AE0 | 40 | 07 | C4 | 58 | 07 | E4 | 34 | 7F | 45 | 40 | 07 | C3 | 58 | 4F | 7F | 47 |
| 0AF0 | 07 | EA | 79 | D7 | 03 | 33 | 81 | 1F | 3A | 7A | F1 | D5 | 01 | 8A | 8F | 8E |
| 0B00 | 8D | 8C | 8B | 21 | 26 | 47 | 76 | 79 | CA | D7 | 61 | CA | 24 | 4B | B6 | 50 |
| 0B10 | 09 | D7 | 61 | CA | 09 | 29 | 03 | 55 | 81 | 86 | 7C | 01 | 00 | 47 | 4B | 4D |
| 0B20 | 4E | 4E | 08 | 76 | 79 | 09 | 75 | 61 | 81 | 21 | 32 | CA | 79 | 11 | FB | D5 |
| 0B30 | 01 | 8C | 8B | 13 | AB | 13 | 8D | 13 | 5F | 14 | E9 | 14 | C8 | 14 | AB | 33 |
| 0B40 | 06 | EB | 4E | 72 | 79 | 67 | 82 | 49 | 79 | 86 | 6B | CC | D5 | F2 | 22 | 31 |
| 0B50 | 36 | 1F | 70 | CA | F0 | CA | 2F | 7E | 1F | 42 | 7D | 13 | 1A | 22 | 7D | 80 |
| 0B60 | B1 | 06 | EA | 47 | 79 | 22 | 7C | 82 | 30 | 81 | CE | F1 | 13 | 09 | 2A | 35 |
| 0B70 | 13 | 09 | 26 | 7F | 04 | 11 | D6 | D7 | 62 | 80 | 81 | F1 | CA | 04 | 1E | A1 |
| 0B80 | F7 | 06 | 68 | 50 | 03 | AA | 4F | 47 | 06 | 9B | 79 | F3 | C8 | F1 | 06 | 95 |
| 0B90 | 53 | 5F | BC | 2C | 30 | 1F | 42 | F8 | 81 | 13 | 0E | 28 | 52 | 5A | BC | B8 |
| 0BA0 | D7 | 61 | CA | 06 | 47 | 40 | 79 | 22 | 7D | 81 | 13 | 25 | 06 | C9 | 77 | 84 |
| 0BB0 | 06 | CA | 73 | F7 | 8A | 73 | F7 | 65 | 88 | F7 | 6F | 83 | 06 | CA | 77 | F7 |
| 0BC0 | F1 | 06 | CA | 50 | 07 | EE | 58 | 4E | 73 | 50 | 23 | 79 | 97 | 03 | FF | 94 |
| 0BD0 | 2B | 50 | 61 | 90 | 23 | 4F | 58 | 4E | 79 | 8A | F1 | F0 | 87 | 2B | 04 | 1A |
| 0BE0 | 11 | 23 | 50 | 66 | A7 | 1F | 28 | 26 | 30 | 8A | 24 | 33 | 1F | 70 | 15 | D4 | 1F |
| 0BF0 | 70 | 2F | 4F | 79 | 22 | 36 | 2A | 34 | 22 | 7D | 98 | 26 | 7F | 80 | 94 | 2F |
| 0C00 | 7F | 91 | F5 | CC | 06 | EA | 4F | 57 | 51 | 5A | 02 | BB | B8 | 06 | E8 | 33 |
| 0C10 | 06 | E6 | 33 | F6 | 10 | 7E | F1 | F0 | CA | 2F | 7E | 13 | 1A | 16 | D9 | 1F |
| 0C20 | 23 | 41 | 09 | 06 | 8E | 04 | 10 | 66 | CC | 41 | 08 | 06 | C9 | 3D | 50 | 5C |
| 0C30 | 78 | BA | 2F | 33 | 32 | 13 | 0B | F1 | D7 | 61 | CA | 2D | 36 | 1F | 71 | 26 |

TABLE II-continued

| | | | | | | | | | | | | | | | | |
|---|---|---|---|---|---|---|---|---|---|---|---|---|---|---|---|---|
| 0C40 | 34 | 1F | 28 | 22 | 36 | 2F | 4F | 79 | 2A | 34 | 35 | 24 | 33 | 2E | 32 | F0 |
| 0C50 | 12 | C6 | 12 | 87 | F1 | F0 | CA | 06 | A2 | 47 | 76 | 79 | 14 | 09 | F1 | D5 |
| 0C60 | 20 | 01 | 8C | 97 | 14 | 78 | 14 | 79 | 14 | 77 | 14 | 60 | 14 | 53 | 14 | 3E |
| 0C70 | 50 | 63 | CA | 2A | 7D | 81 | 31 | CA | 2A | 34 | 11 | 75 | 50 | 63 | CA | F4 |
| 0C80 | 13 | 91 | 2E | 32 | B2 | 00 | 47 | 4B | 4D | 08 | 4C | 77 | CA | 09 | 06 | 49 |
| 0C90 | 76 | 79 | 22 | 33 | F4 | 15 | A7 | 15 | AA | F4 | CA | 15 | 28 | 00 | 00 | 50 |
| 0CA0 | 03 | 31 | 84 | 2A | 4B | 76 | 79 | CA | 03 | 44 | BB | B6 | 50 | 61 | CA | 61 |
| 0CB0 | 80 | 81 | F4 | CA | 06 | A3 | 47 | 76 | 79 | 53 | 79 | 06 | AF | E1 | 2E | 31 |
| 0CC0 | 9C | 50 | 21 | 7D | CA | 61 | CA | 61 | 15 | EC | 61 | 80 | CA | 06 | A4 | 47 |
| 0CD0 | 76 | 79 | 1E | 7F | 04 | 1A | 4D | 1E | 7F | 04 | 18 | 1D | 21 | 32 | 1E | 7F |
| 0CE0 | 16 | D6 | 1E | 7F | 06 | 8D | 50 | 60 | 58 | BB | 2E | 7D | 9D | 06 | 84 | 06 |
| 0CF0 | 83 | 47 | 76 | 79 | 16 | 3D | F8 | 94 | FB | 84 | 2E | 35 | 24 | 30 | CA | 63 |
| 0D00 | 80 | CA | 2B | 1F | 4B | D7 | 62 | 14 | C2 | 14 | BE | 35 | A1 | 06 | AF | 51 |
| 0D10 | 59 | BC | A4 | F4 | CA | 2D | 36 | 14 | 32 | F1 | D7 | 62 | CA | 62 | 80 | CA |
| 0D20 | 1F | 6F | D5 | 06 | 47 | 77 | 92 | 40 | 79 | 1F | 70 | 06 | 49 | 4F | 79 | 1F |
| 0D30 | 28 | 24 | 33 | 2A | 35 | F0 | 14 | 09 | 14 | BE | 79 | 4C | 75 | 09 | 43 | 73 |
| 0D40 | 80 | 82 | 06 | D3 | 88 | 47 | 73 | 80 | B2 | 06 | D2 | 81 | 06 | D1 | 09 | 01 |
| 0D50 | 47 | 4B | 4D | 4E | 79 | 06 | 8F | 33 | 04 | 1B | FF | C8 | E01A | 51 | 22 | |
| 0D60 | 7F | 81 | 15 | D4 | 37 | 15 | D0 | D5 | 61 | 87 | 61 | 15 | 6B | 69 | 79 | F1 |
| 0D70 | 15 | E6 | F0 | CA | 06 | 6B | 53 | 77 | F7 | 61 | F7 | 22 | 7D | CA | 04 | 19 |
| 0D80 | FC | 85 | 06 | 6C | 53 | 57 | 5C | BB | 1F | 6E | 1F | 61 | 06 | 94 | 46 | 04 |
| 0D90 | 1F | 64 | 15 | A4 | F0 | 15 | 4B | 26 | 7F | 99 | 04 | 1E | A1 | F7 | F3 | C8 |
| 0DA0 | 1A | 51 | 1F | 60 | 06 | 68 | 53 | 5F | BC | 04 | 1F | 67 | 06 | 68 | 50 | 06 |
| 0DB0 | 6B | 79 | 2F | 31 | F1 | 13 | 0B | 09 | 1D | 37 | 09 | 06 | BF | 04 | C7 | 04 |
| 0DC0 | CE | 04 | CE | 04 | CE | 04 | CE | 7A | 06 | 48 | 50 | 06 | BF | 04 | C7 | B2 |
| 0DD0 | 06 | BF | 51 | 55 | 58 | BB | 7A | 21 | 11 | AE | C0 | 58 | 02 | BB | BA | F6 |
| 0DE0 | 06 | E9 | 34 | 7A | 2F | 4F | 13 | D3 | A3 | FE | F7 | F6 | BF | BE | B7 | B6 |
| 0DF0 | FF | 86 | E7 | 8C | AF | A1 | 98 | 80 | F8 | 82 | 92 | 99 | B0 | A4 | F9 | C0 |
| 0E00 | 49 | 04 | CC | 04 | AF | 4D | 04 | CF | BF | 00 | 04 | CC | 04 | AF | 40 | 04 |
| 0E10 | CF | 04 | 90 | 4F | 04 | CC | 58 | B6 | 00 | 04 | CF | BF | 48 | 04 | CC | 04 |
| 0E20 | AF | 08 | 04 | CF | 7A | 4F | 4E | 4D | 4C | 4B | 06 | 41 | 79 | 41 | 04 | A7 |
| 0E30 | 03 | EE | B9 | F9 | 41 | 04 | A7 | 03 | EE | 80 | 82 | 04 | A2 | AE | 4F | 1F |
| 0E40 | 5C | 06 | 8D | 40 | 58 | BC | 1E | 7F | 1E | 98 | 04 | CC | 06 | 8D | 00 | 04 |
| 0E50 | CF | 1E | FF | 1E | 7F | 06 | 41 | 50 | 01 | 86 | 14 | E0 | 12 | C3 | 84 | 14 |
| 0E60 | 1D | 04 | 10 | 07 | 04 | 10 | 8D | 06 | FB | 04 | C7 | 23 | 1E | 79 | 04 | CC |
| 0E70 | 06 | EE | 00 | 04 | CF | 1E | 79 | 04 | CC | 06 | 8D | 00 | 04 | CF | 00 | 7A |
| 0E80 | 2B | 52 | 56 | 5C | BB | 7A | 48 | 04 | CC | 04 | AF | 00 | 04 | CF | 49 | 08 |
| 0E90 | 00 | 04 | CC | BF | 50 | 04 | CF | 61 | 47 | 4F | 04 | CC | 04 | 3F | 00 | 04 |
| 0EA0 | CF | BF | 4E | 04 | CC | 04 | AF | 40 | 04 | CF | 72 | 79 | 48 | 04 | CC | 04 |
| 0EB0 | AF | 00 | 04 | CF | 78 | 16 | 6E | 04 | CC | 50 | 66 | 79 | 04 | CB | 00 | 7A |
| 0EC0 | 4F | 4E | 4D | 06 | 46 | 79 | 1F | BB | 4F | 1F | 5C | 1E | 98 | 04 | CC | BF |
| 0ED0 | 00 | 04 | CF | 4A | BF | 04 | CC | 04 | AF | 00 | 04 | CF | 1F | DD | 04 | CC |
| 0EE0 | 06 | 8D | BF | 04 | CF | 50 | BF | 04 | CC | 58 | BF | 04 | CF | 04 | 3F | 4F |
| 0EF0 | 04 | CC | 04 | AF | 50 | 04 | CF | 58 | 04 | CF | 4B | BF | 04 | CC | 04 | AF | 00 |
| 0F00 | 58 | B6 | 04 | CC | 04 | 3F | 00 | 04 | CF | 4B | BF | 04 | CC | 04 | AF | 00 |
| 0F10 | 04 | CF | 1F | DD | 06 | 46 | 7C | 17 | 79 | 7D | 14 | 09 | 43 | 09 | 06 | 8D |
| 0F20 | 17 | 97 | 3A | 04 | CC | 42 | 08 | 4F | 04 | CF | 6F | 8A | 00 | 04 | CC | 78 |
| 0F30 | B6 | 00 | 04 | CF | 38 | 84 | 3B | 04 | CC | 00 | AC | 04 | CC | 48 | 04 | AF |
| 0F40 | 04 | CF | 00 | 7A | 04 | 79 | 80 | BB | 10 | 6F | 41 | 04 | A7 | 03 | EE | B3 |
| 0F50 | F9 | 41 | 04 | A7 | 03 | EE | 80 | 7A | 04 | A2 | A8 | 3D | 7F | 4F | 47 | 58 |
| 0F60 | 3D | 7E | 4F | 47 | 58 | 81 | 16 | 3F | 3D | 7D | 4F | 47 | 58 | 3D | 7C | 4F |
| 0F70 | 47 | 58 | 00 | 78 | A5 | 06 | 41 | 50 | 62 | 12 | FE | 23 | 50 | 6B | 00 | 03 |
| 0F80 | AA | 80 | 4F | 79 | 16 | 3E | 23 | 50 | 65 | 4A | 79 | 12 | D5 | 4F | 4E | 4D |
| 0F90 | 4C | 4B | 20 | 79 | 06 | D3 | 4F | 58 | BC | 7A | 06 | A2 | 7F | 4E | 4F | 4D |
| 0FA0 | 07 | 48 | 79 | 06 | BF | 04 | C7 | 45 | 04 | CE | 6F | BB | 07 | 67 | 50 | 04 |
| 0FB0 | C7 | 04 | CC | 7A | 50 | 61 | 81 | 79 | 7A | 46 | 5C | B7 | 7A | 06 | A1 | 4F |
| 0FC0 | 58 | BC | 24 | 30 | 7A | 4F | 06 | 49 | 7F | 4B | 7E | 6E | 7D | 6F | 06 | C4 |
| 0FD0 | 56 | 06 | E4 | 30 | 7A | 06 | CE | 2B | 52 | 5E | BC | 7A | 06 | F3 | 4F | 58 |
| 0FE0 | BC | 7A | 06 | 91 | 41 | 09 | 3D | 50 | 58 | 00 | 78 | B9 | 7A | 28 | 43 | B4 |
| 0FF0 | 04 | 79 | 10 | 6F | 04 | A4 | 4E | 04 | A7 | 61 | B4 | 7A | 00 | 00 | 00 | 00 |

The language as set forth in the foregoing Tables I and II, when permanently stored in the read only memories of the respective microcomputers 410 and 532 will effect the operations as set forth. The language stored, of course, includes the tables from which the search start and search end constants are read, in obtaining the service search operations, such tables being provided in the read only memory 418 in the embodiment of FIGS. 1-21 and in the 4096×8 ROM of the microcomputer 532 of the embodiment of FIGS. 22-27. The "FUTURE CODE" address of the random access memory 420 in the embodiment of FIGS. 1-21 and a similar address of the 192×4 RAM of the microcomputer 532 form a memory portion for temporarily containing a frequency code developed by the processor means and other memory portions are contained in such random access memories, for use in obtaining the operations described in detail hereinabove. When search limits are established from the keyboard and are temporarily stored, they are stored in the "SEARCH START" and "SEARCH END" addresses of the random access memory 420 of the embodiment of FIGS. 1-21, and in the 192×4 RAM of the microcomputer 532 in the embodiment of FIGS. 22-27. Channels for identifying frequency codes, supplied by an operator through the keyboard, are stored in an additional memory, the memory 434 in the first embodiment and the memory 630 in the second embodiment. It will be understood that such memories may be included in microcomputer chips, if desired.

It will be appreciated by those skilled in the art that although in the system as illustrated and described the various functions are implemented using a microcomputer arrangement, they can be implemented by other forms of apparatus and various features of the invention are not limited to the use of a microcomputer arrangement.

As above noted, the required memory capability of the micrcomputer is greatly reduced through the operation produced by the use of the language as set forth. The system of the invention is further advantageous in that it reduces the time required to tune to a new frequency during the search or scan modes and the reduction in time is especially advantageous in the system as disclosed which is capable of automatically searching through a large number of groups of frequencies under service designations. It is further noted that such features and advantages are obtained in a receiver which is also capable of manual and scan modes of operation.

It will be understood that modifications and variations may be effected without departing from the spirit and scope of the novel concepts of this invention.

What is claimed is:

1. In a scanning radio receiver, including frequency synthesizer means for generating a local oscillator signal for mixing with a received signal to produce an IF signal at a certain IF frequency, said frequency synthesizer means being digitally controlled and being responsive to applied frequency codes to develop a local oscillator frequency for reception of a signal at a frequency corresponding to the applied frequency code, a detector circuit for responding to said IF signal and including means for developing on a signal present line an indication of the receipt of a signal by the receiver, keyboard means for supplying control data, processor means coupled to said detector circuit through said signal present line and coupled to said frequency synthesizer means for control thereof, timer means operatively associated with said processor means, said processor means including means for testing for the presence or absence of a signal on said signal present line and further including a read only memory and a random access memory for storing data, the control data supplied by said keyboard means and the data stored by said read only and random access memory being such that frequencies to be scanned by said receiver are determinable therefrom, said processor means being operative to develop a frequency code for supply to said synthesizer means in accordance with said control and stored data, said random access memory having a first frequency code memory portion for temporarily containing a frequency code developed by said processor means, said processor means being controlled by said timer means to process said control and stored data to develop and supply a frequency code to said first frequency code memory portion and to thereafter output said frequency code from said first frequency code memory portion to said synthesizer means and to thereafter process control and stored data and develop and supply a new frequency code to said first frequency code, memory portion, said processor means being also controlled by said timer means for operating after supply of a new frequency code to said first frequency code memory portion to effect a test of said signal present line, and said processor means being responsive to the absence of a signal on said signal present line in said test thereof for output of said new frequency code from said first frequency code memory portion to said synthesizer means.

2. In a receiver as defined in claim 1, an additional memory operatively associated with said processor means and arranged to store data in a plurality of channels for identifying frequency codes, said processor means being operable in response to control data supplied by an operator through said keyboard means to store in said channels of said additional memory data which identifies the codes of a plurality of received frequencies to be scanned.

3. In a receiver as defined in claim 2, said processor means being operative in response to data supplied from said keyboard means for operation in a manual mode to be stepped from one channel to another in response to data supplied from said keyboard means.

4. In a receiver as defined in claim 3, said random access memory including a second frequency code portion for registering a frequency code upon output thereof to said synthesizer to preserve said code for a manual mode of operation.

5. In a receiver as defined in claim 2, said keyboard means being operative by an operator to store in said random access memory a flag signal signifying a priority status of one of said channels, and said processor means being operative to periodically output a frequency code corresponding to that of a channel having a priority status.

6. In a receiver as defined in claim 5, said random access memory including a second frequency code memory portion for registering a frequency code upon output thereof to said synthesizer for use in accommodating priority status checking operations.

7. In a receiver as defined in claim 1, said random access memory including a second frequency code memory portion for registering a frequency code upon output thereof to said synthesizer to thereby contain data as to the present frequency, and said processor means including means for processing data including the code contained in said second frequency code memory portion to develop a new frequency code for establishing a new frequency differing from the present frequency by a certain incremental value, said scanning ratio receiver being thereby operable in a search mode to sequentially and automatically scan through frequencies differing by incremental values.

8. In a receiver as defined in claim 7, said processor means including limit means for obtaining a sequence in which a frequency code corresponding to a first limit frequency is initially output from said first frequency code memory portion and wherein frequency codes corresponding to frequencies differing therefrom by said certain incremental value are output from said first frequency code memory portion until a second limit frequency is reached so as to establish limits of the frequency range scanned by said receiver in said sequence.

9. In a receiver as defined in claim 8, means responsive to control data from said keyboard means for storing data in said random access memory establishing said first and second limits.

10. In a receiver as defined in claim 8, said read only memory being arranged for permanent storage of data establishing said first and second limits to obtain scanning through a predetermined band of frequencies.

11. In a receiver as defined in claim 10, said read only memory being operative for permanent storage of data establishing a plurality of sets of said first and second limits for permitting a scanning operation through a plurality of predetermined bands of frequencies.

12. In a receiver as defined in claim 11, said processor means being operative to selectively operate in a search mode to scan through any selected one of said bands in accordance with data supplied from said keyboard means.

13. In a receiver as defined in claim 1, said receiver being selectively operable through control data from said keyboad means for operation in manual, scan and service search modes, an additional memory operatively associated with said processor means and arranged to store data in a plurality of channels for identifying frequency codes, said keyboard means being operative by an operator to store in said channels of said additional memory data identifying received frequencies to be scanned in said scan mode, said read only memory being arranged for permanent storage of data for processing by said processor means for searching through a series of frequencies in at least one band in said service search mode, and said processor means being operative from said keyboard means for stepping from one of said frequency channels to another under selective control by the operator in said manual mode.

14. In a receiver as defined in claim 13, said processor means in said service search mode being operative to search through a specific set of frequencies corresponding to a selected service.

15. In a receiver as defined in claim 1, said read only memory being arranged for permanent storage of service group identification data establishing a plurality of service bands at least one of which includes frequencies in more than one of three frequency bands respectively designated as low, high and UHF frequency bands, the low band including frequencies in a range less than 100 MHz, the high band including frequencies in a range of between 100 and 200 MHz and the UHF band including frequencies in a range above 200 MHz, said keyboard means including service keys for selection of said service bands to effect scanning of all of the frequencies in each service band, and said keyboard means further including independently actuatable low, high and UHF band de-selection means for operating during scanning of a selected service band to prevent scanning of frequencies in said low band when said low band de-selection key is actuated, to prevent scanning of frequencies in said high band when said high band de-selection key is actuated and to prevent scanning of frequencies in said UHF band when said UHF band de-selection key is actuated.

16. In a receiver as defined in claim 1, said processor means including means for effecting operation of said timer means to test said signal present line and to effect a change from one frequency to another at a certain scanning rate in the continued absence of a signal on said signal present line, and means for adjusting said scanning rate.

17. In a scanning radio receiver, including frequency synthesizer means for generating a local oscillator signal for mixing with a received signal to produce an IF signal at a certain IF frequency, said frequency synthesizer means being digitally controlled and being responsive to an applied frequency code to develop a local oscillator frequency for reception of a signal at a frequency corresponding to the applied frequency code, a detector circuit for responding to said IF signal and including means for developing on a signal present line an indication of the receipt of a signal by the receiver, keyboard means for supplying control data, processor means coupled to said detector circuit through said signal present line and coupled to said frequency synthesizer means for control thereof, said processor means including a read only memory and a random access memory, frequencies to be scanned by said receiver being determinable from the control data from said keyboard means and data stored in said read only and random access memories, said processor means being operative to develop a frequency code for supply to said synthesizer means in accordance with said control and stored data, timer means operatively associated with said processor means and operative for establishing a time interval for said synthesizer means to adjust to a new frequency, said processor means being operable in response to data from said signal present line, said keyboard means and said timer means to effect a scanning operation in which a series of frequency codes are output sequentially with said scanning operation being interrupted when and so long as a signal is produced on said signal present line, said read only memory being arranged for permanent storage of service group identification data establishing a plurality of service bands at least one of which includes frequencies in more than one of three frequency bands respectively designated as low, high and UHF frequency bands, the low band including frequencies in a range less than 100 MHz, the high band including frequencies in a range of between 100 and 200 MHz and the UHF band including frequencies in a range above 200 MHz, said keyboard means including service keys for selection of said device bands to effect scanning of all of the frequencies in each service band, and said keyboard means further including low, high and UHF band de-selection means for operating during scanning of a selected service band to prevent scanning of frequencies in said low band when said low band de-selection key is actuated, to prevent scanning of frequencies in said high band when said high band de-selection key is actuated and to prevent scanning of frequencies in said UHF band when said UHF band de-selection key is actuated.

* * * * *